(12) United States Patent
Wang et al.

(10) Patent No.: US 11,114,407 B2
(45) Date of Patent: Sep. 7, 2021

(54) INTEGRATED FAN-OUT PACKAGE AND MANUFACTURING METHOD THEREOF

(71) Applicant: Taiwan Semiconductor Manufacturing Co., Ltd., Hsinchu (TW)

(72) Inventors: Jhih-Yu Wang, New Taipei (TW); Hung-Jui Kuo, Hsinchu (TW); Yu-Hsiang Hu, Hsinchu (TW); Sih-Hao Liao, New Taipei (TW); Yung-Chi Chu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/009,211

(22) Filed: Jun. 15, 2018

(65) Prior Publication Data

US 2019/0385975 A1 Dec. 19, 2019

(51) Int. Cl.
*H01L 23/00* (2006.01)
*H01L 23/544* (2006.01)
*H01L 25/065* (2006.01)

(52) U.S. Cl.
CPC ............ *H01L 24/82* (2013.01); *H01L 23/544* (2013.01); *H01L 24/02* (2013.01); *H01L 24/24* (2013.01);

(Continued)

(58) Field of Classification Search
CPC ......... H01L 24/02; H01L 24/24; H01L 24/25; H01L 24/82; H01L 23/544;

(Continued)

(56) References Cited

U.S. PATENT DOCUMENTS

| 7,795,717 B2 * | 9/2010 | Goller | ................. | H01L 23/5389 257/685 |
| 8,173,539 B1 * | 5/2012 | Huang | .................. | G03F 9/7084 438/622 |

(Continued)

FOREIGN PATENT DOCUMENTS

| CN | 102738064 | 10/2012 |
| CN | 105225966 | 1/2016 |

(Continued)

OTHER PUBLICATIONS

"Office Action of Taiwan Counterpart Application", dated May 11, 2020, p. 1-p. 4.

(Continued)

*Primary Examiner* — Dale E Page
*Assistant Examiner* — Quovaunda Jefferson
(74) *Attorney, Agent, or Firm* — JCIPRNET

(57) ABSTRACT

An integrated fan-out (InFO) package includes an encapsulant, a die, a plurality of conductive structures, and a redistribution structure. The die and the conductive structures are encapsulated by the encapsulant. The conductive structures surround the die. The redistribution structure is disposed on the encapsulant. The redistribution structure includes a plurality of routing patterns, a plurality of conductive vias, and a plurality of alignment marks. The conductive vias interconnects the routing patterns. At least one of the alignment mark is in physical contact with the encapsulant.

20 Claims, 39 Drawing Sheets

(52) U.S. Cl.
CPC .......... *H01L 24/25* (2013.01); *H01L 25/0655* (2013.01); *H01L 2223/54426* (2013.01); *H01L 2223/54486* (2013.01); *H01L 2224/02313* (2013.01); *H01L 2224/02331* (2013.01); *H01L 2224/02379* (2013.01); *H01L 2224/02381* (2013.01); *H01L 2224/24011* (2013.01); *H01L 2224/24137* (2013.01); *H01L 2224/24155* (2013.01); *H01L 2224/25171* (2013.01); *H01L 2224/82106* (2013.01); *H01L 2224/82132* (2013.01)

(58) Field of Classification Search
CPC ....... H01L 25/0655; H01L 2224/82132; H01L 2224/82106; H01L 2224/24011; H01L 2224/24137; H01L 2224/24155; H01L 2224/25171; H01L 2224/02331; H01L 2224/02378; H01L 2224/02381; H01L 2224/02313; H01L 2223/54481; H01L 2223/54426

See application file for complete search history.

(56) References Cited

U.S. PATENT DOCUMENTS

| | | | |
|---|---|---|---|
| 8,361,842 B2* | 1/2013 | Yu | ........................ H01L 21/561 257/E21.499 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,543,262 B1* | 1/2017 | Koutney, Jr. | ............ H01L 24/11 |
| 10,276,543 B1* | 4/2019 | Liao | ....................... H01L 23/544 |
| 2001/0050437 A1* | 12/2001 | Saito | ...................... G03F 9/7084 257/758 |
| 2002/0028528 A1* | 3/2002 | Ohtaka | .................. H01L 23/544 438/48 |
| 2006/0087044 A1 | 4/2006 | Goller | |
| 2009/0206411 A1* | 8/2009 | Koketsu | .................. H01L 24/81 257/368 |
| 2009/0244864 A1 | 10/2009 | Kim et al. | |
| 2009/0244865 A1* | 10/2009 | Tanaka | .................... H05K 1/185 361/764 |
| 2009/0321947 A1* | 12/2009 | Pratt | ..................... H01L 23/481 257/777 |
| 2012/0028411 A1 | 2/2012 | Yu et al. | |
| 2012/0056315 A1* | 3/2012 | Chang | .................. H01L 21/6835 257/737 |
| 2015/0035161 A1 | 2/2015 | Miao et al. | |
| 2015/0348904 A1* | 12/2015 | Huang | ................ H01L 23/5383 257/774 |
| 2015/0348916 A1* | 12/2015 | Chen | .................... H01L 23/3142 257/669 |
| 2016/0005695 A1 | 1/2016 | Tai et al. | |
| 2017/0278802 A1 | 9/2017 | Chen et al. | |

FOREIGN PATENT DOCUMENTS

| | | |
|---|---|---|
| CN | 105321912 | 2/2016 |
| CN | 107195618 | 9/2017 |
| CN | 108122784 | 6/2018 |
| TW | 201733058 | 9/2017 |

OTHER PUBLICATIONS

"Office Action of China Counterpart Application", dated Sep. 28, 2020, p. 1-p. 9.

* cited by examiner

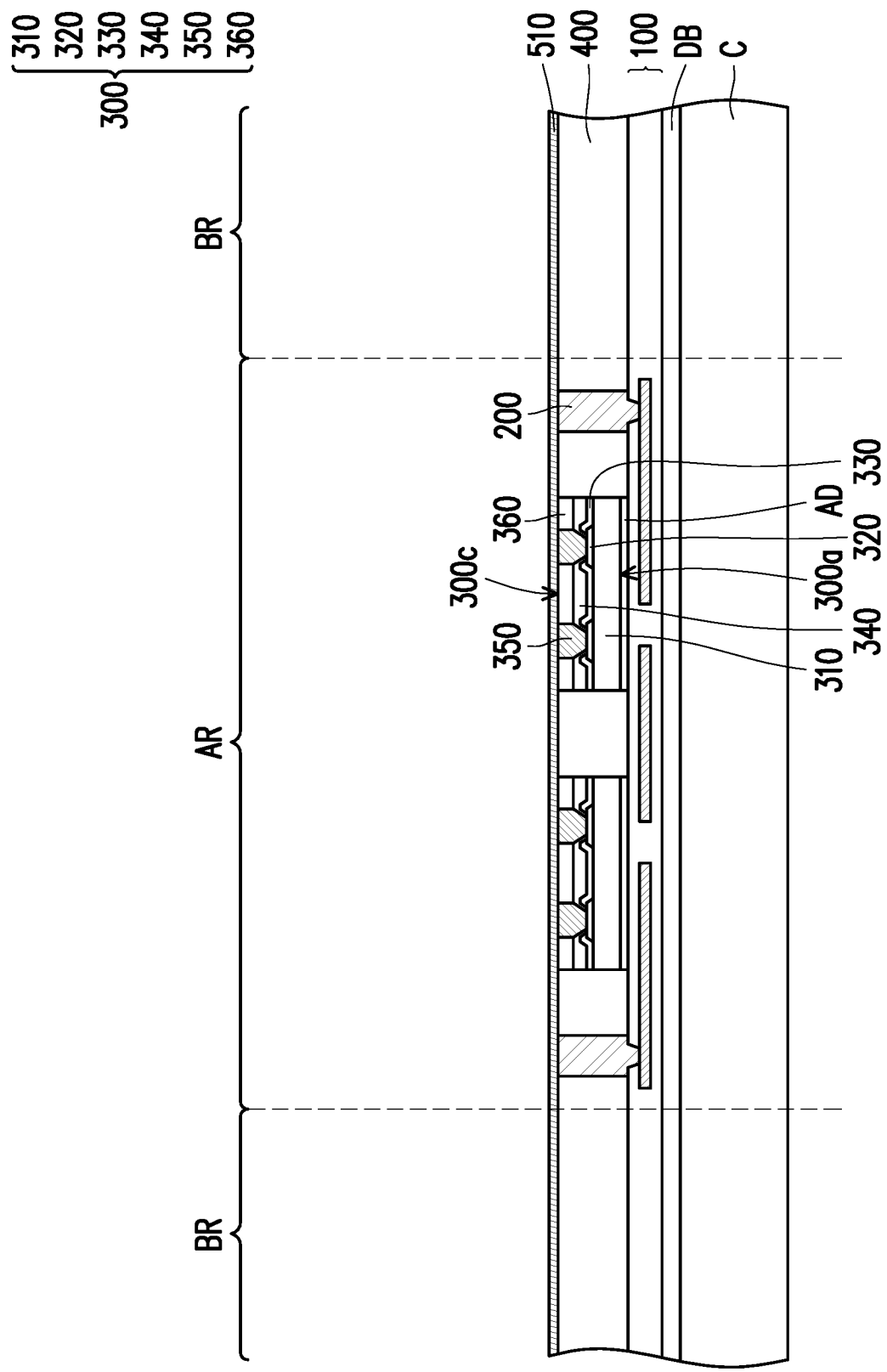

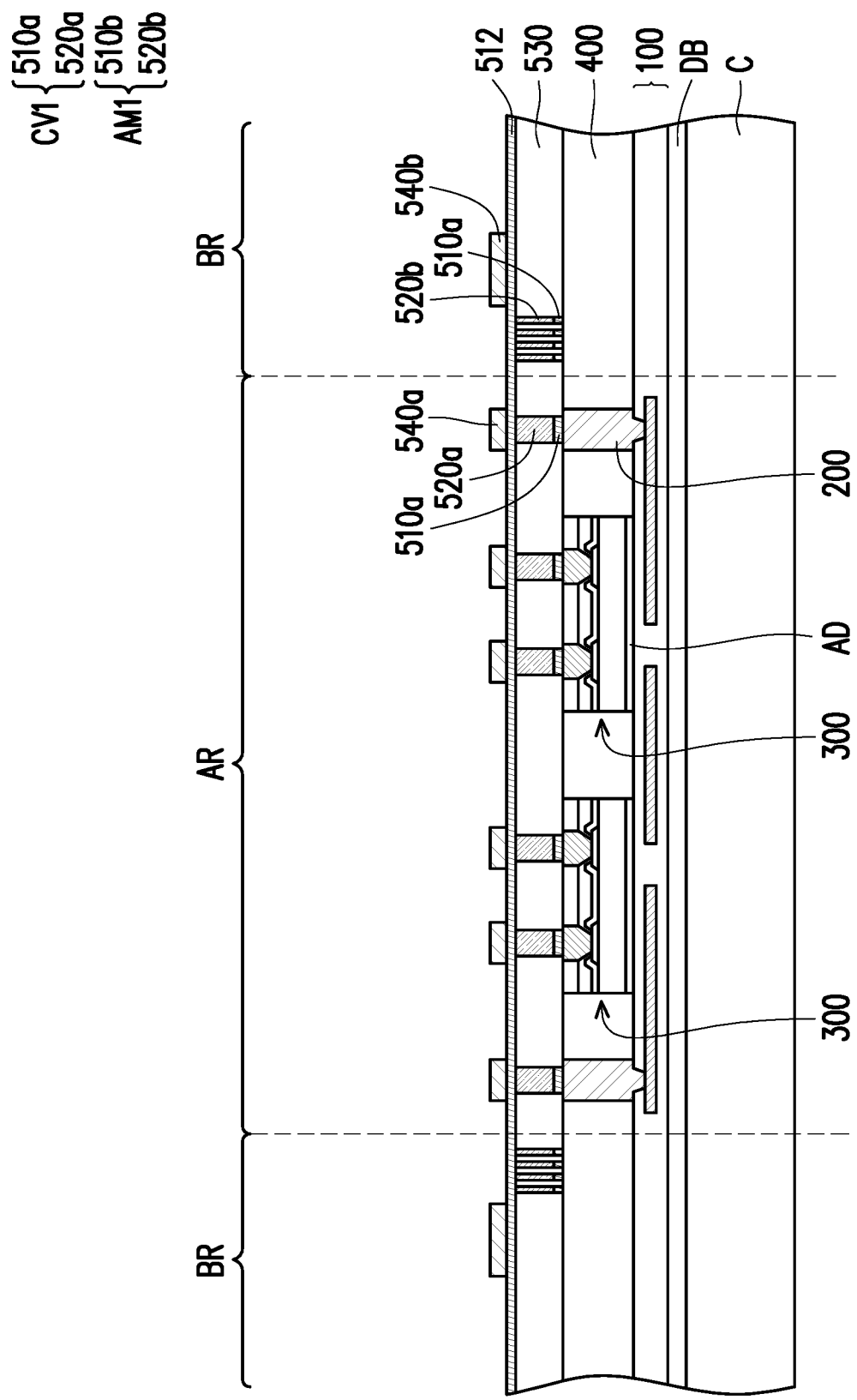

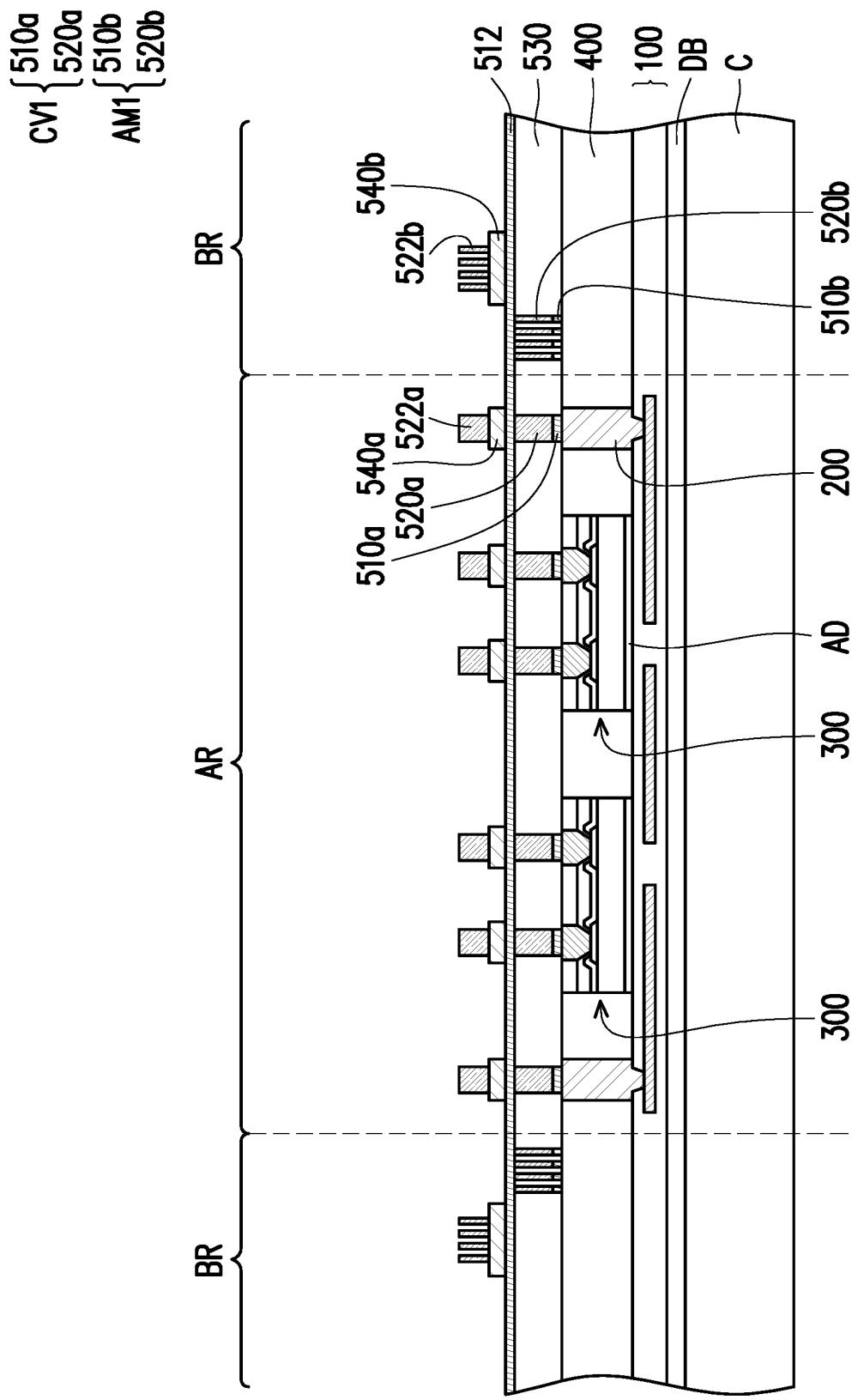

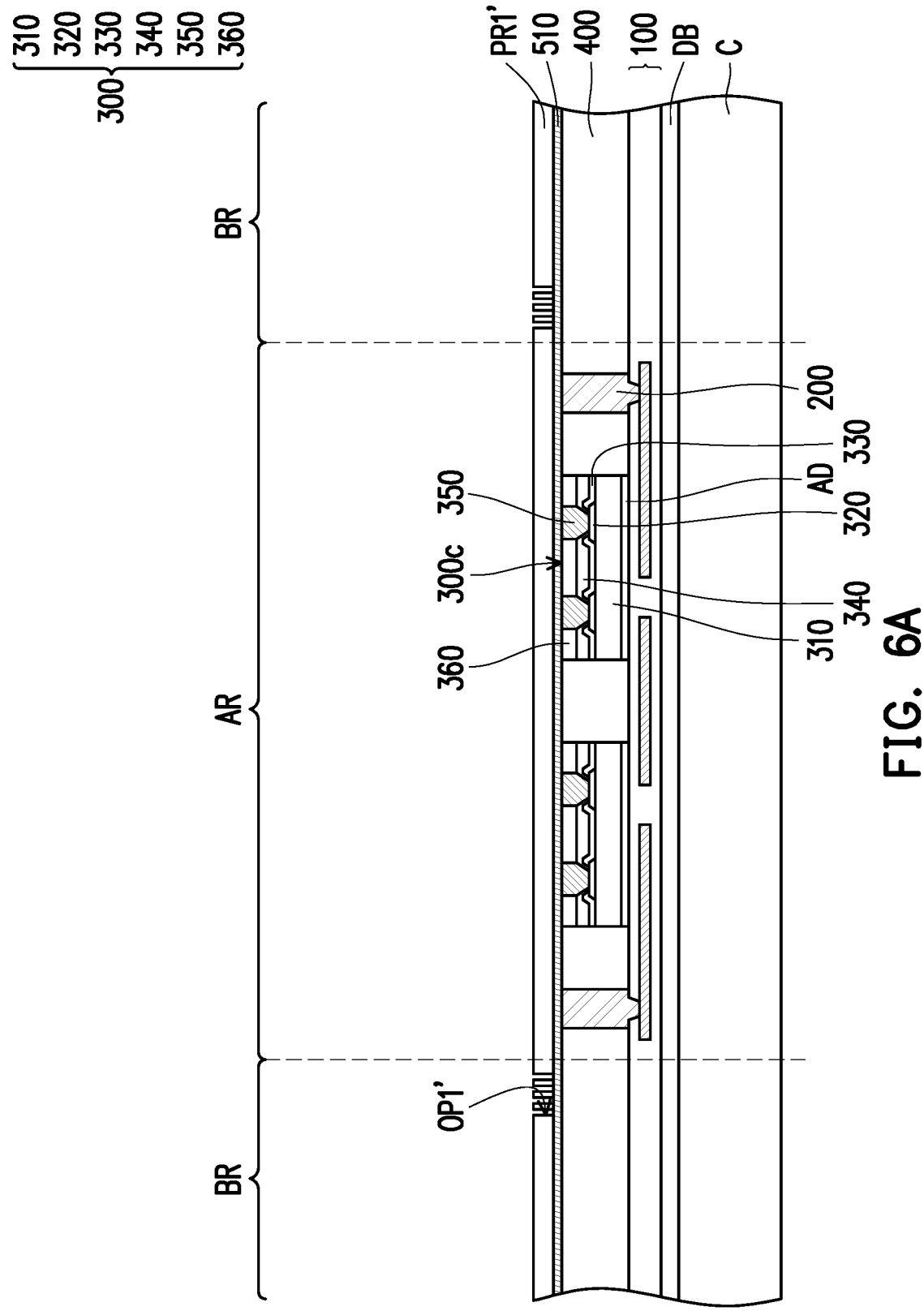

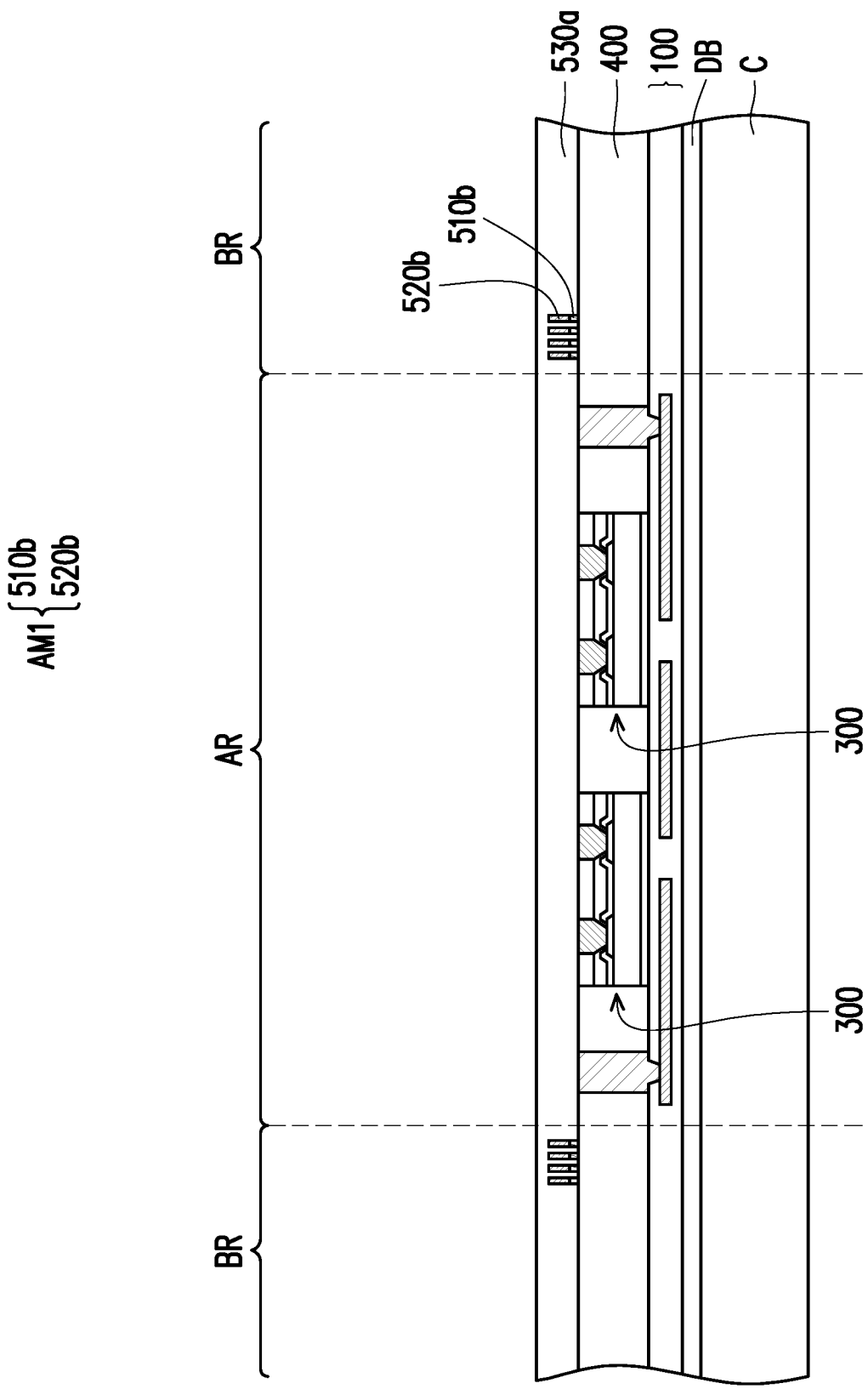

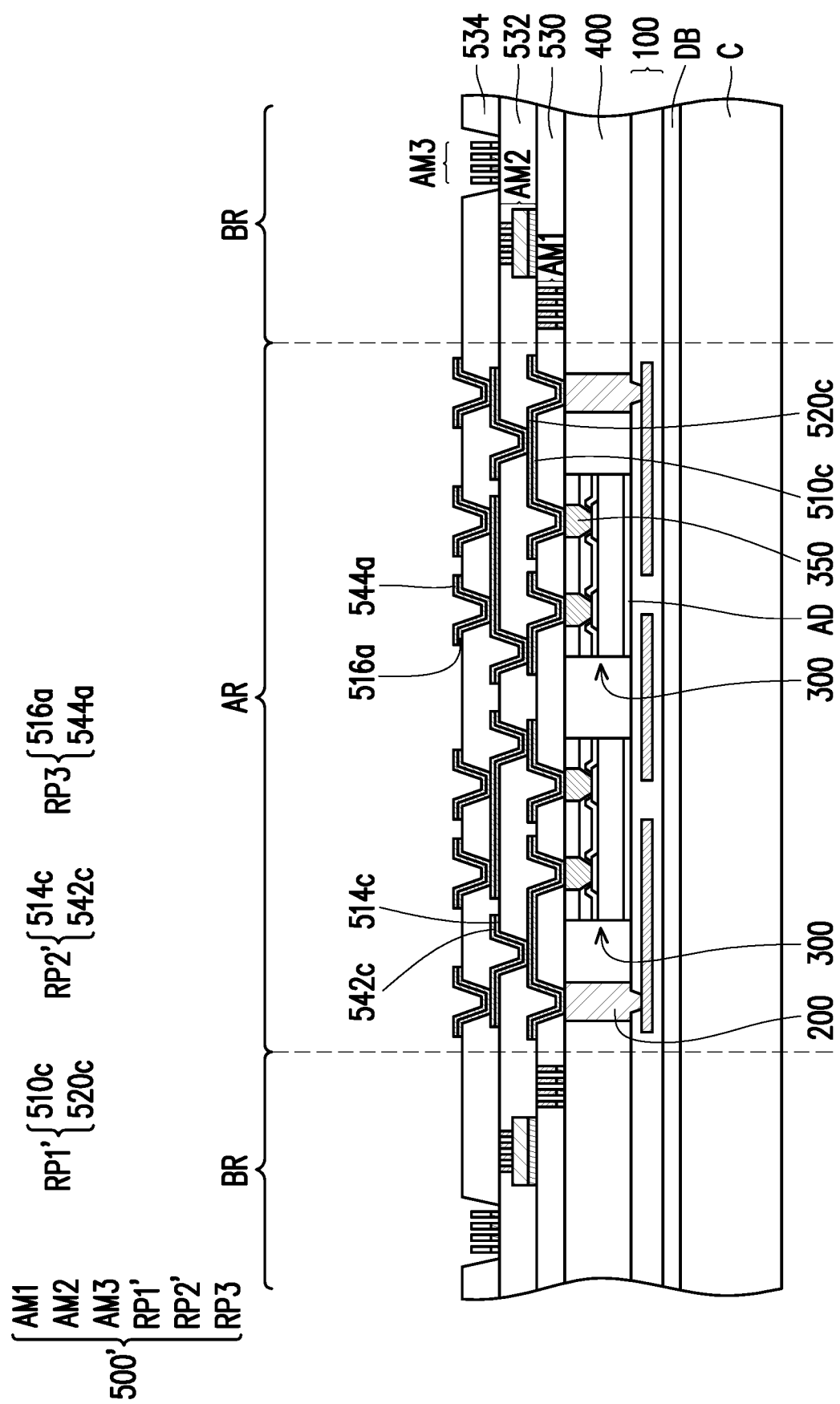

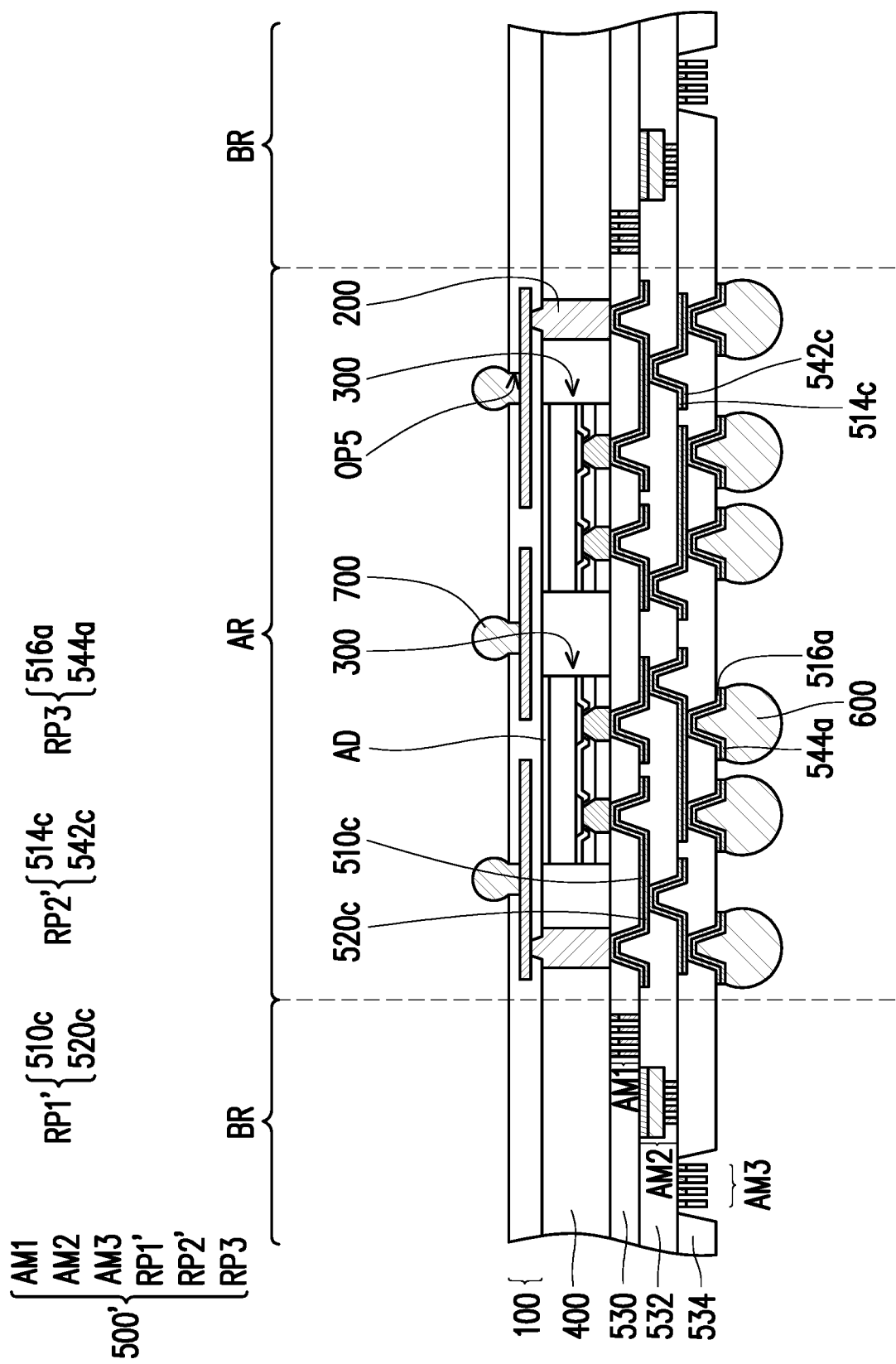

INTEGRATED FAN-OUT PACKAGE AND MANUFACTURING METHOD THEREOF

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. However, there are many challenges related to integrated fan-out packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A to FIG. 6I are schematic cross-sectional views illustrating intermediate stages of a manufacturing process of an InFO package in accordance with some alternative embodiments of the disclosure.

DETAILED DESCRIPTION

Figure 1A:
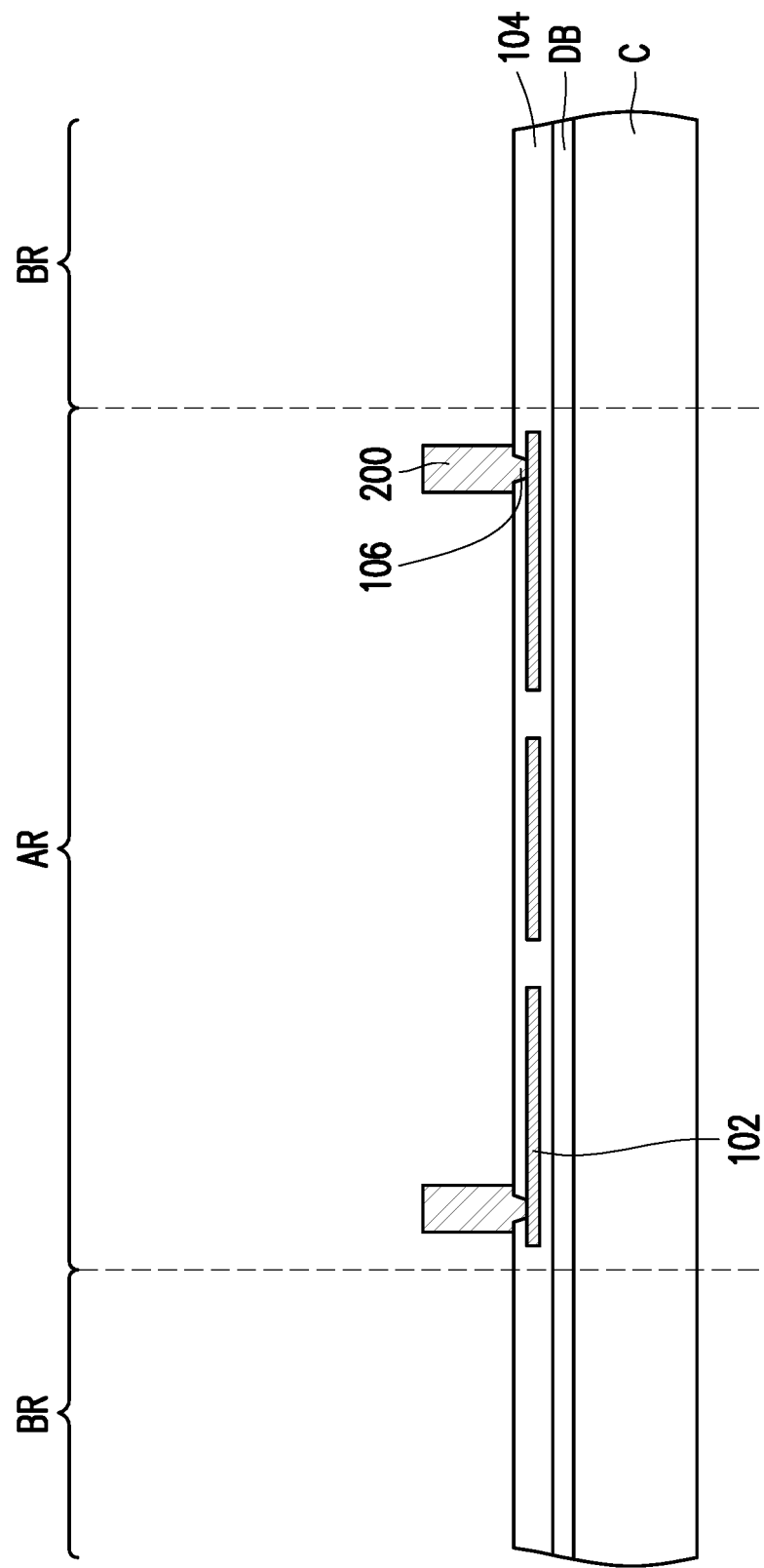
FIG. 1A to FIG. 1Y are schematic cross-sectional views illustrating a manufacturing process of an integrated fan-out (InFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
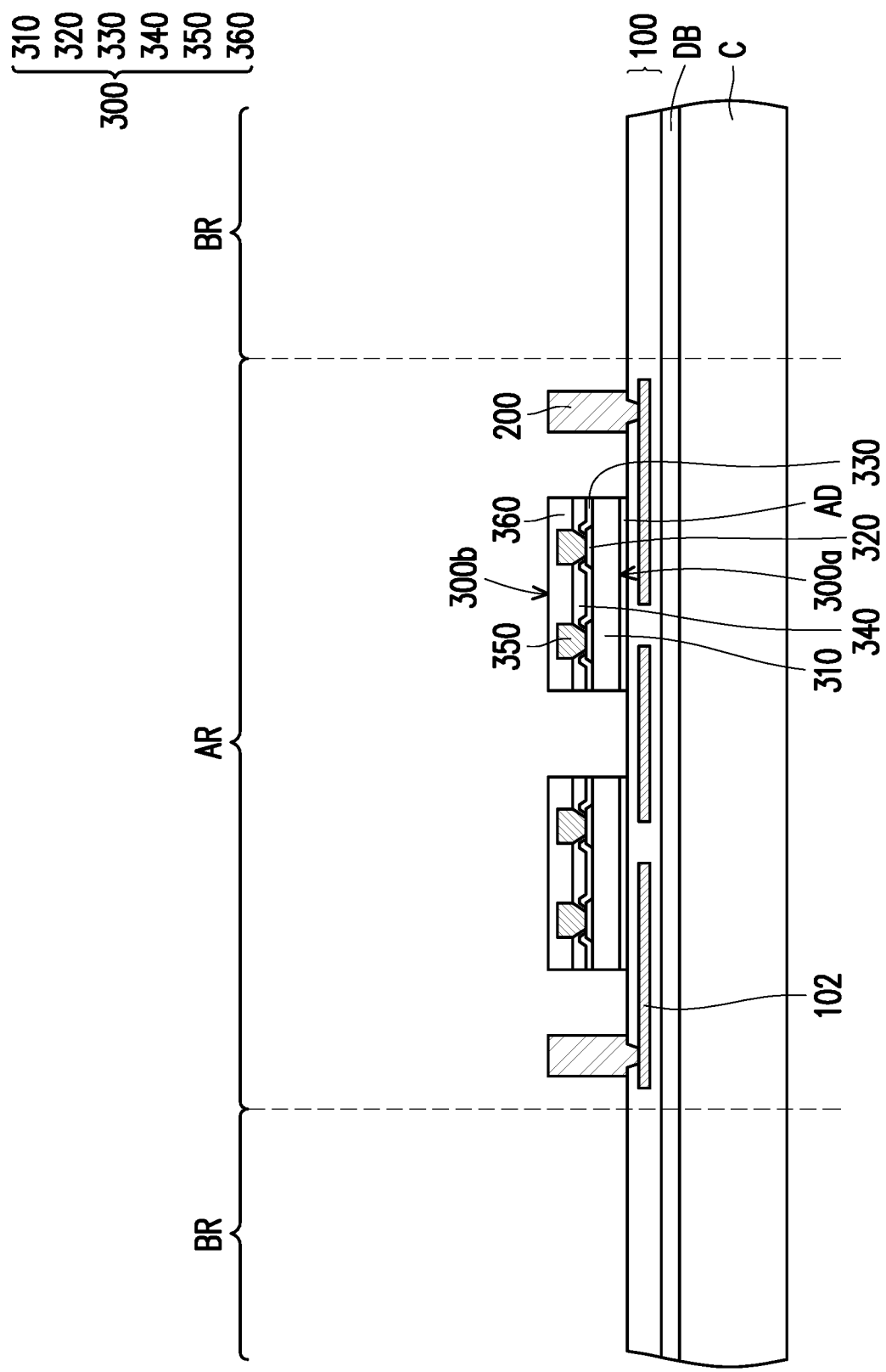
Figure 1C:
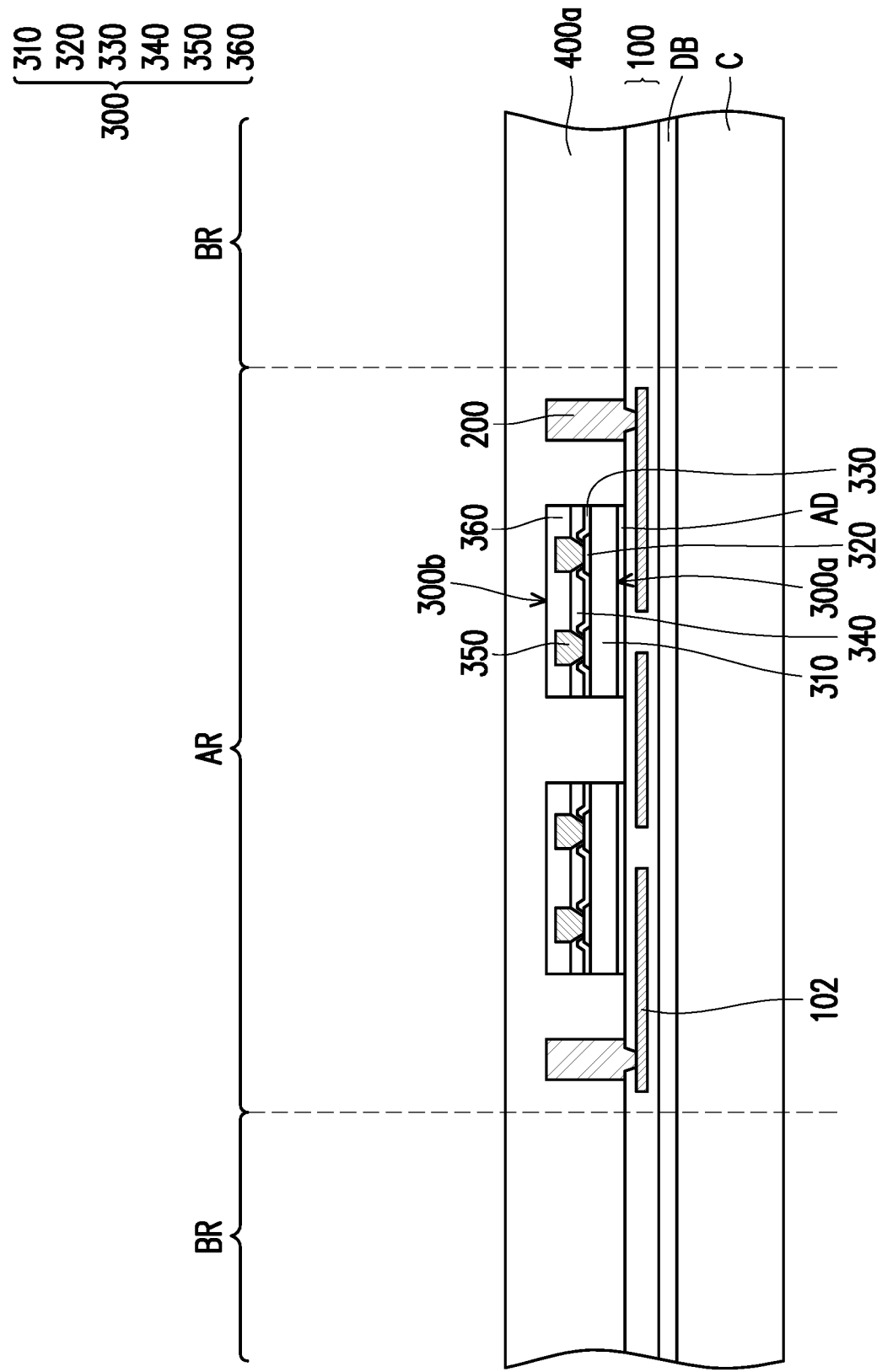
Figure 1D:
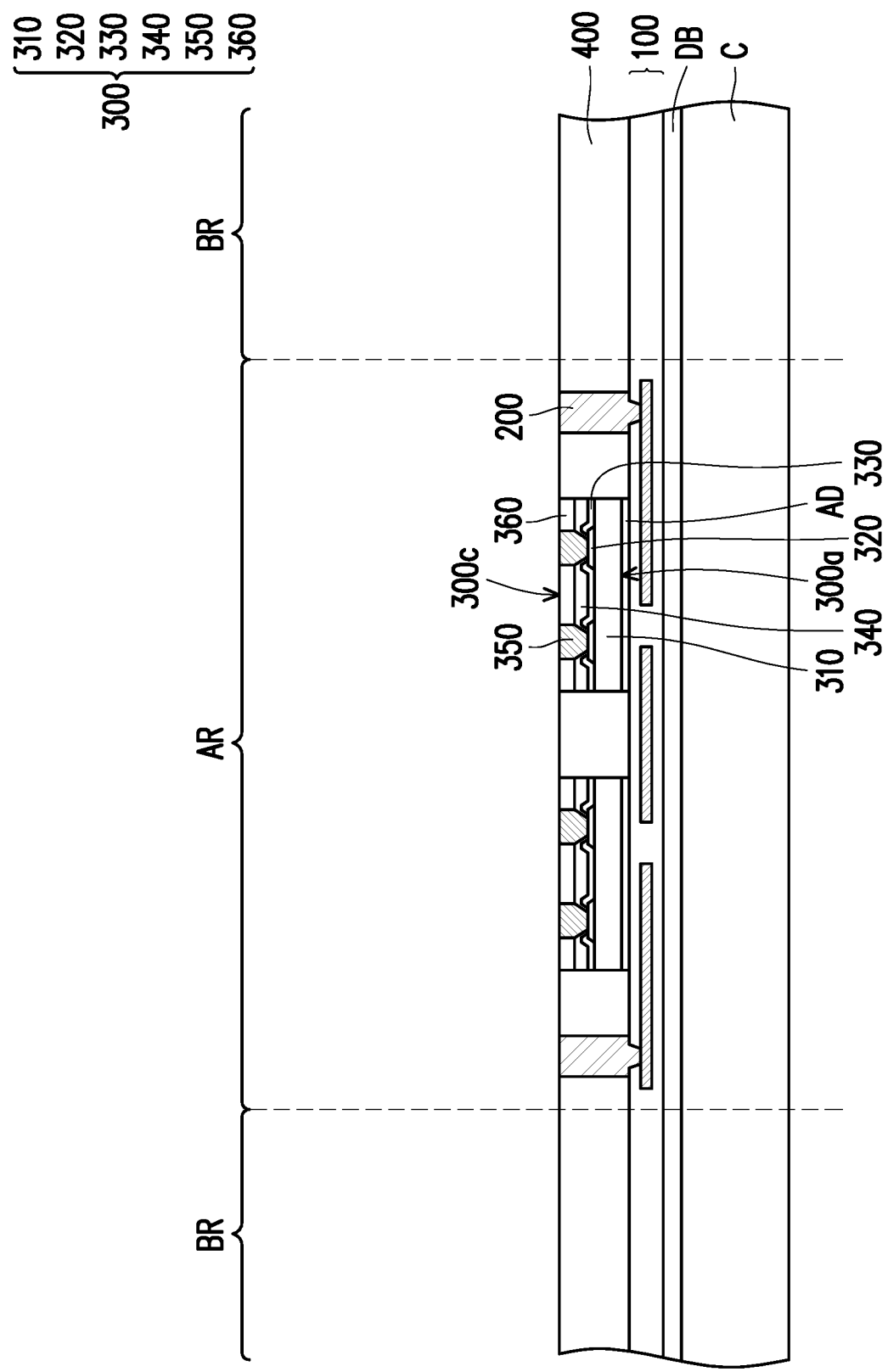
Figure 1F:
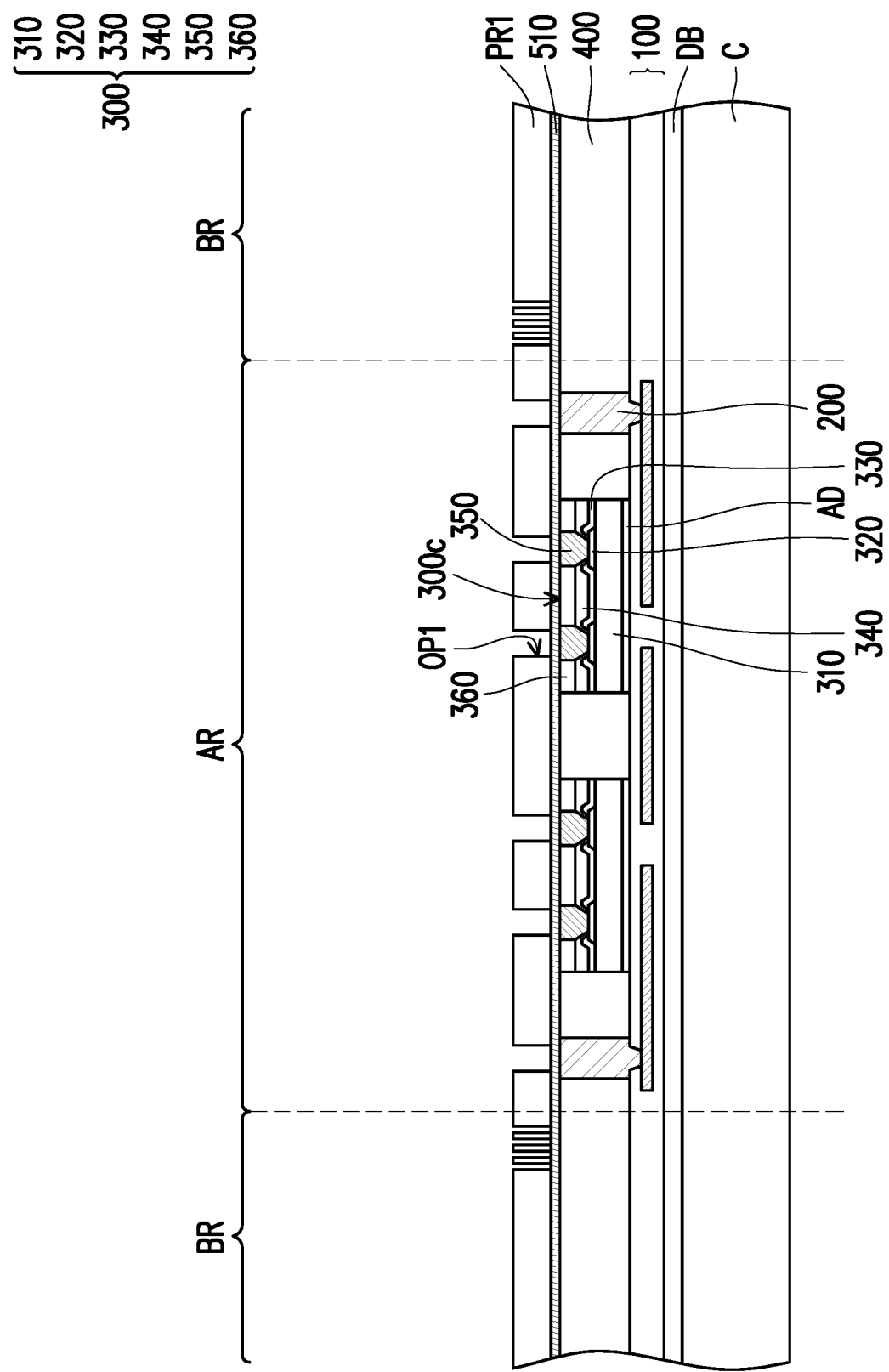
Figure 1G:
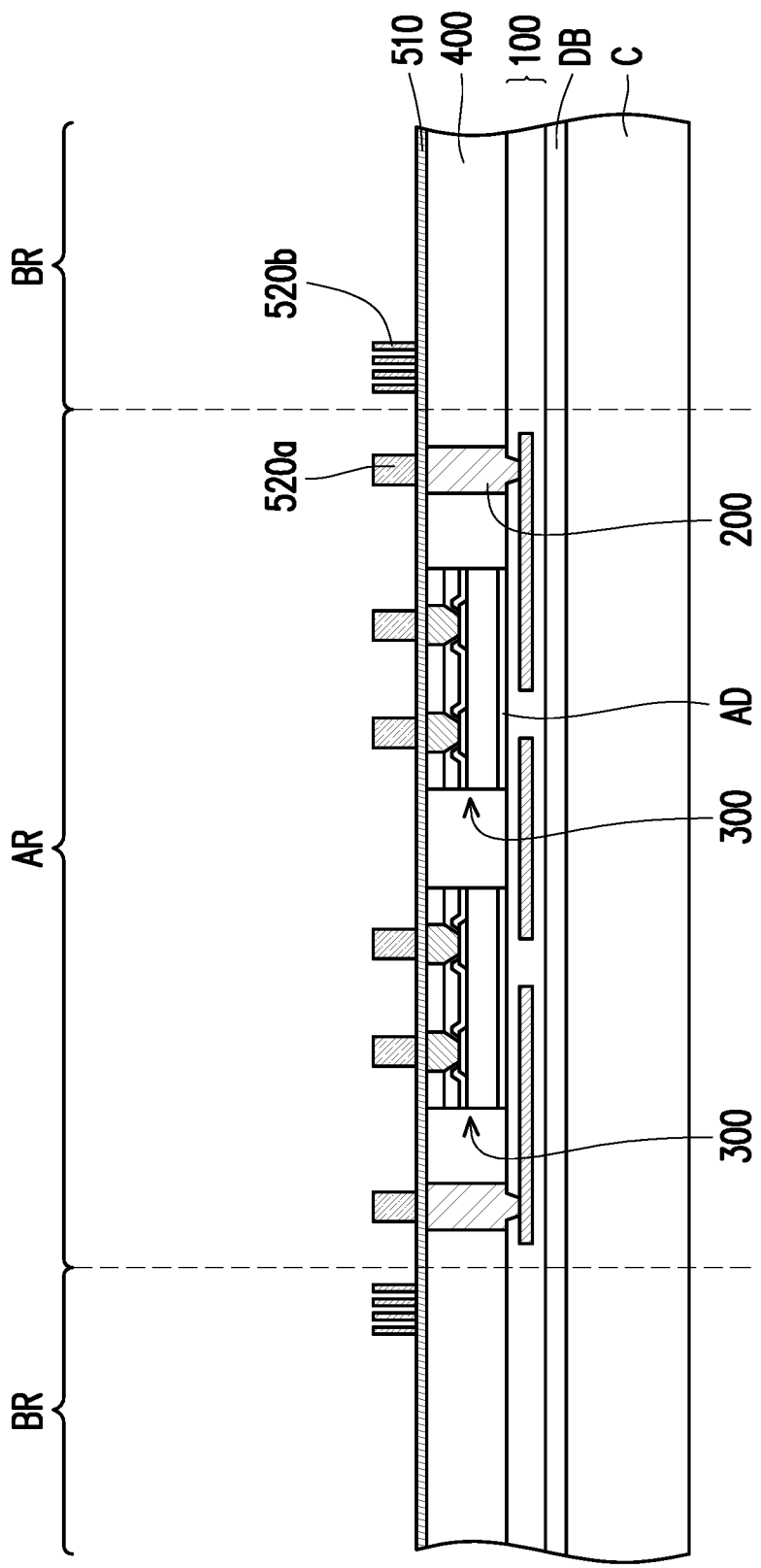
Figure 1H:
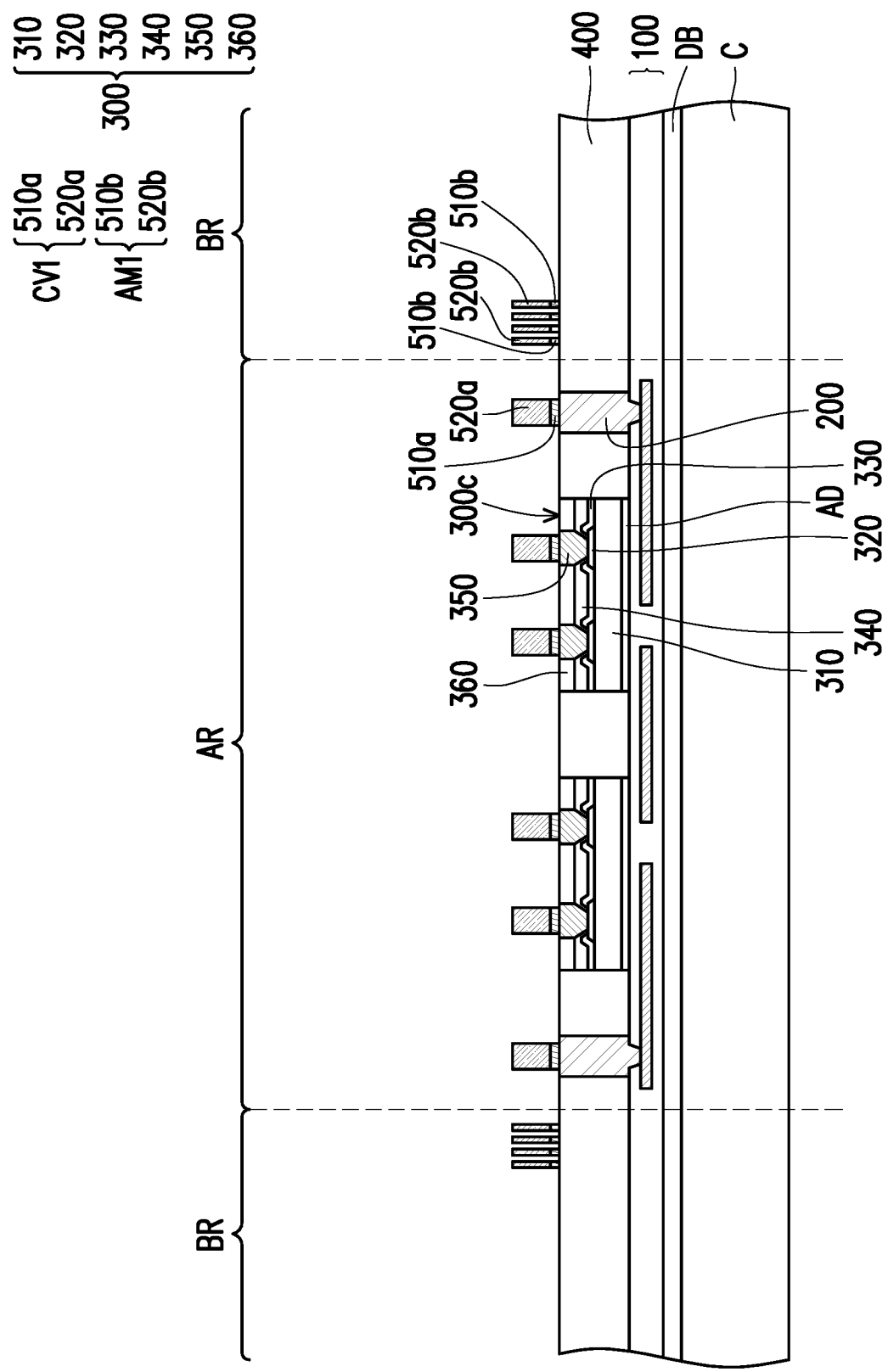
Figure 1I:
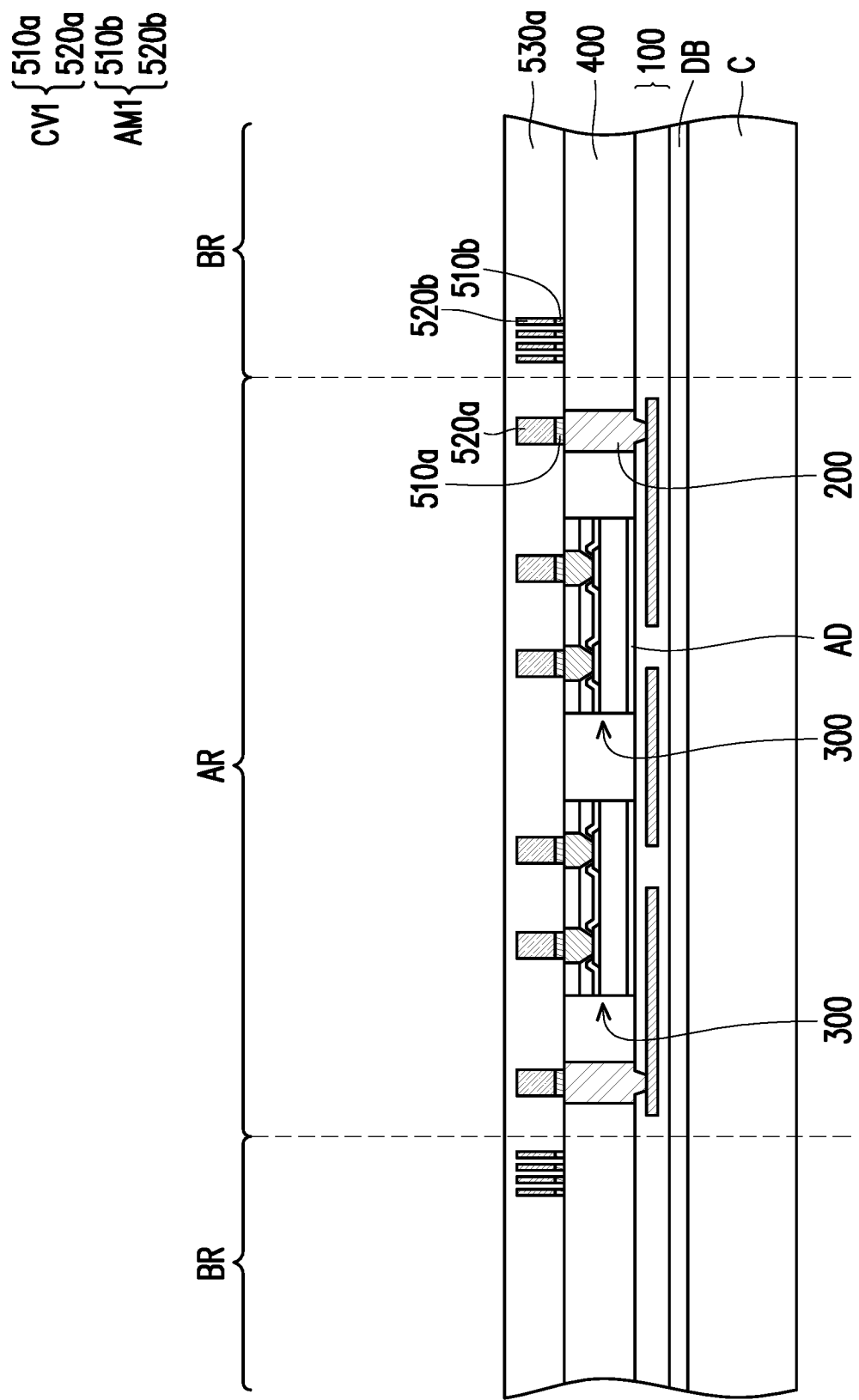
Figure 1J:
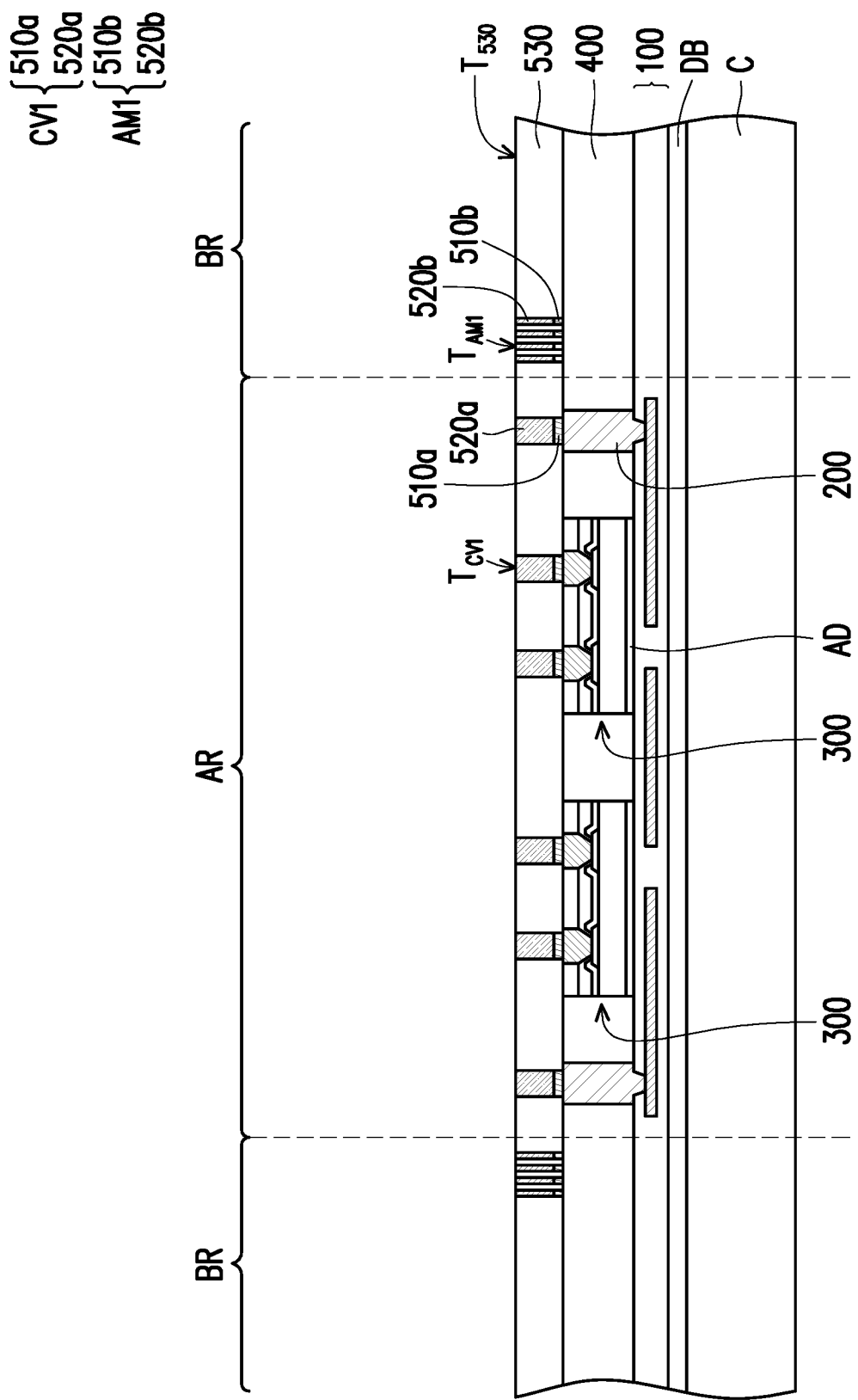
Figure 1K:
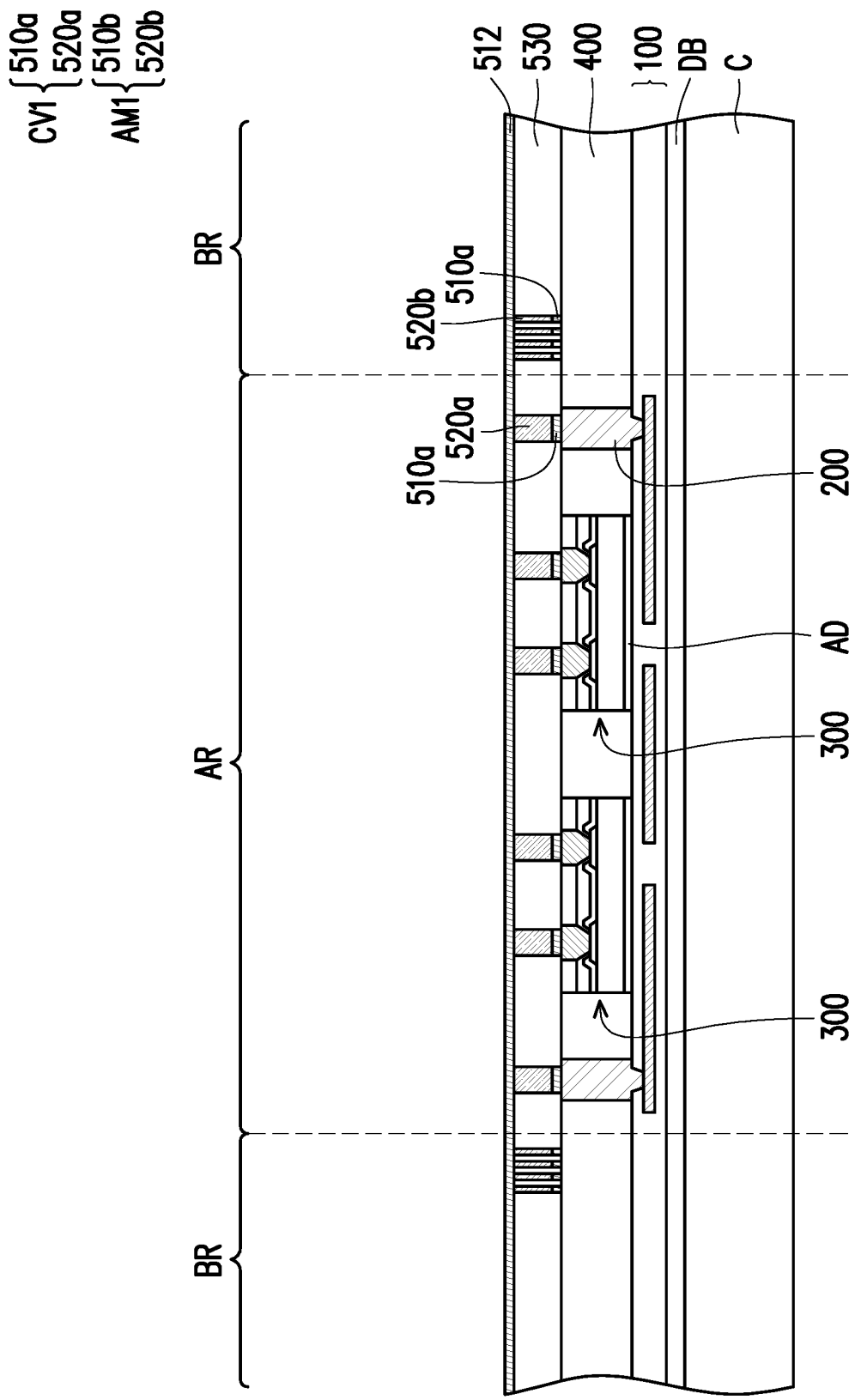
Figure 1L:
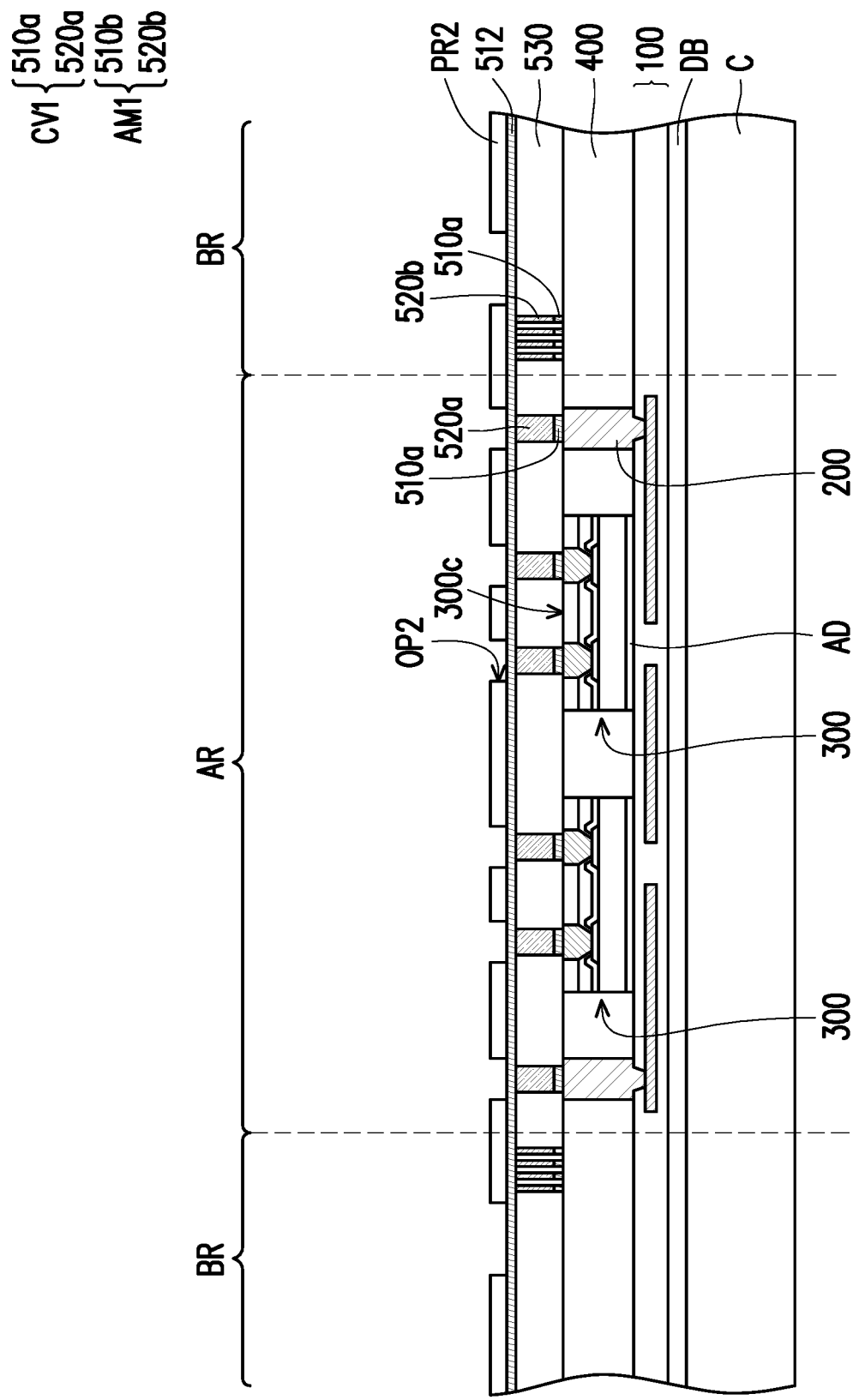
Figure 1N:
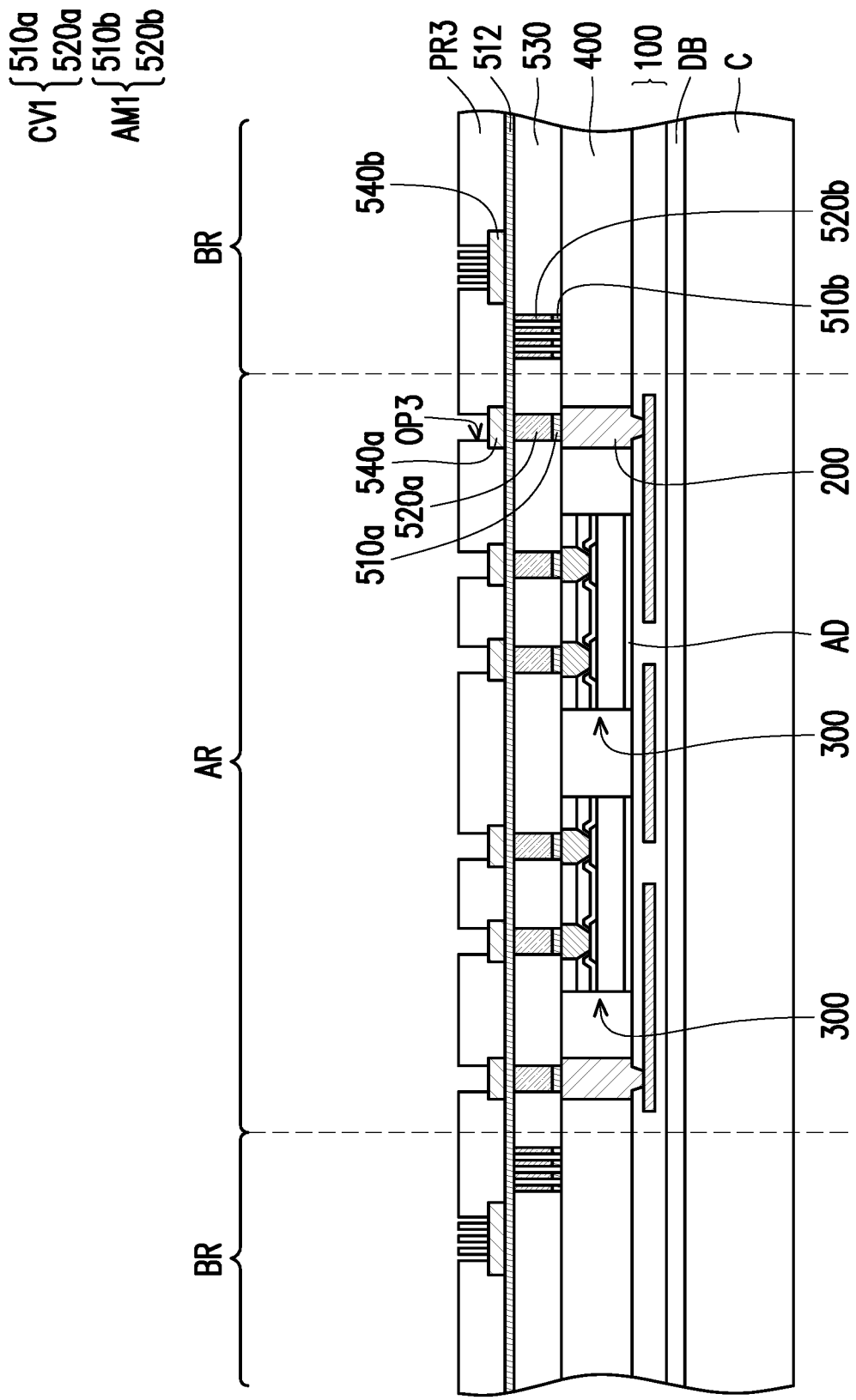
Figure 1P:
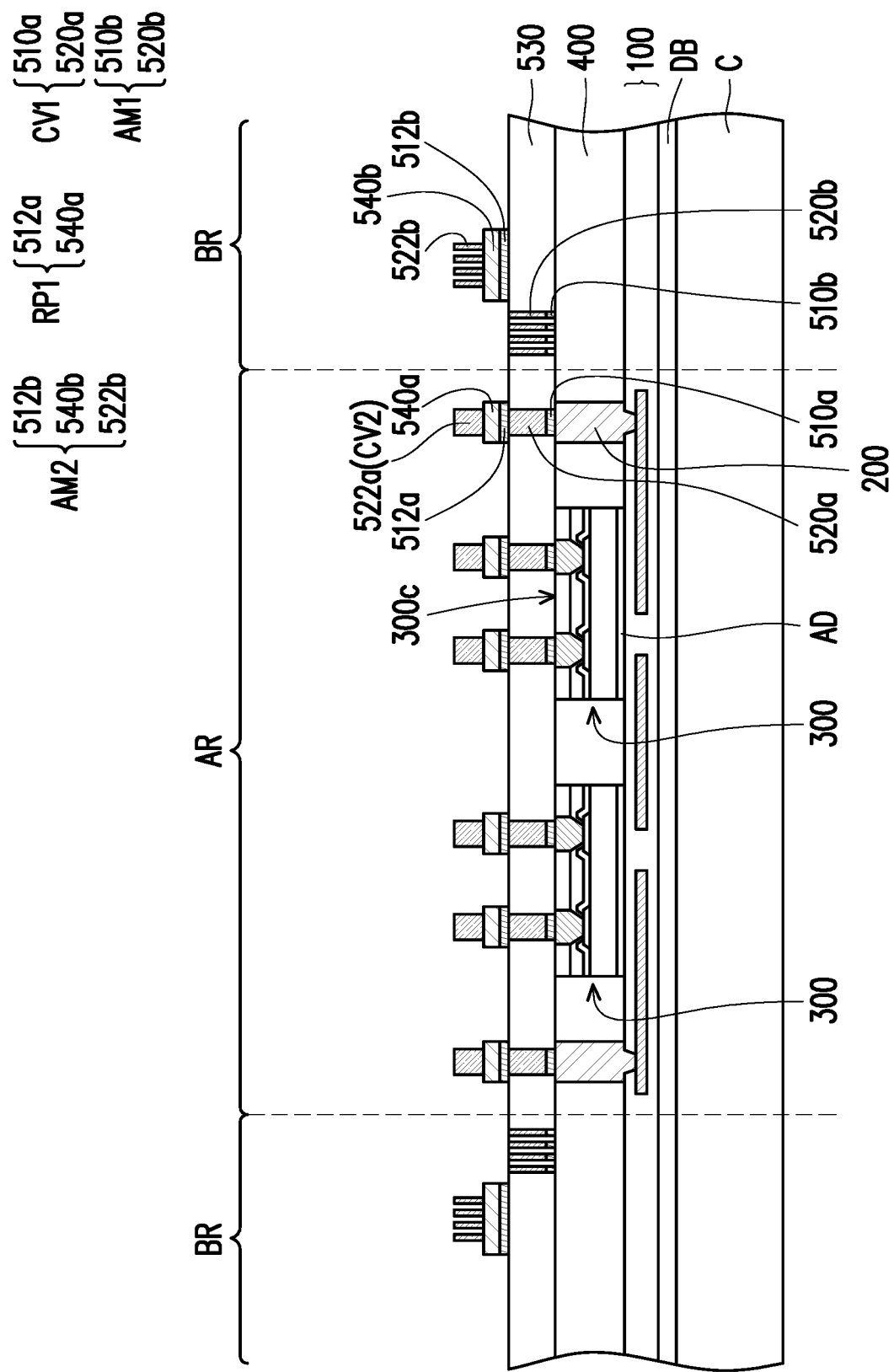
Figure 1Q:
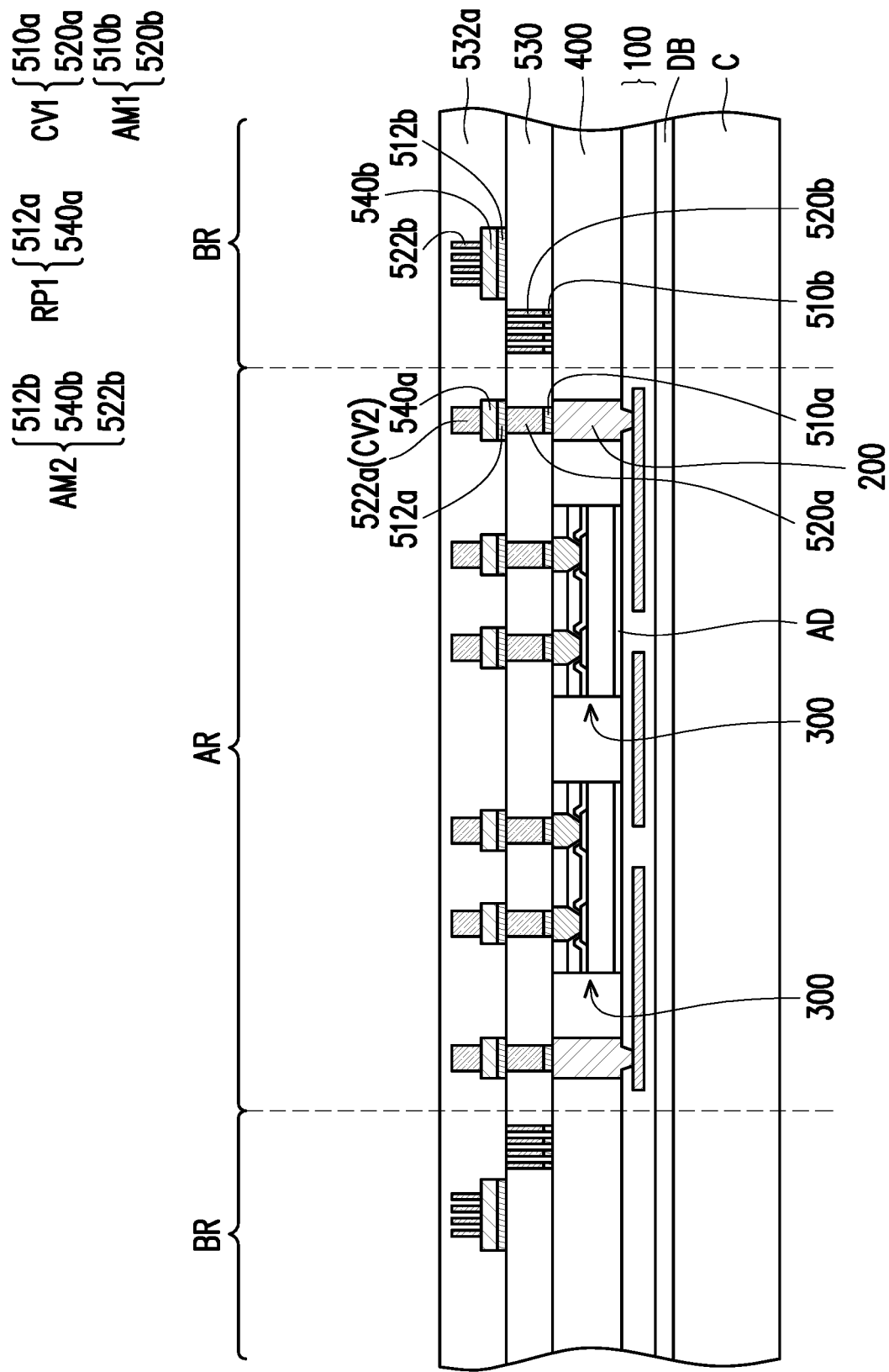
Figure 1R:
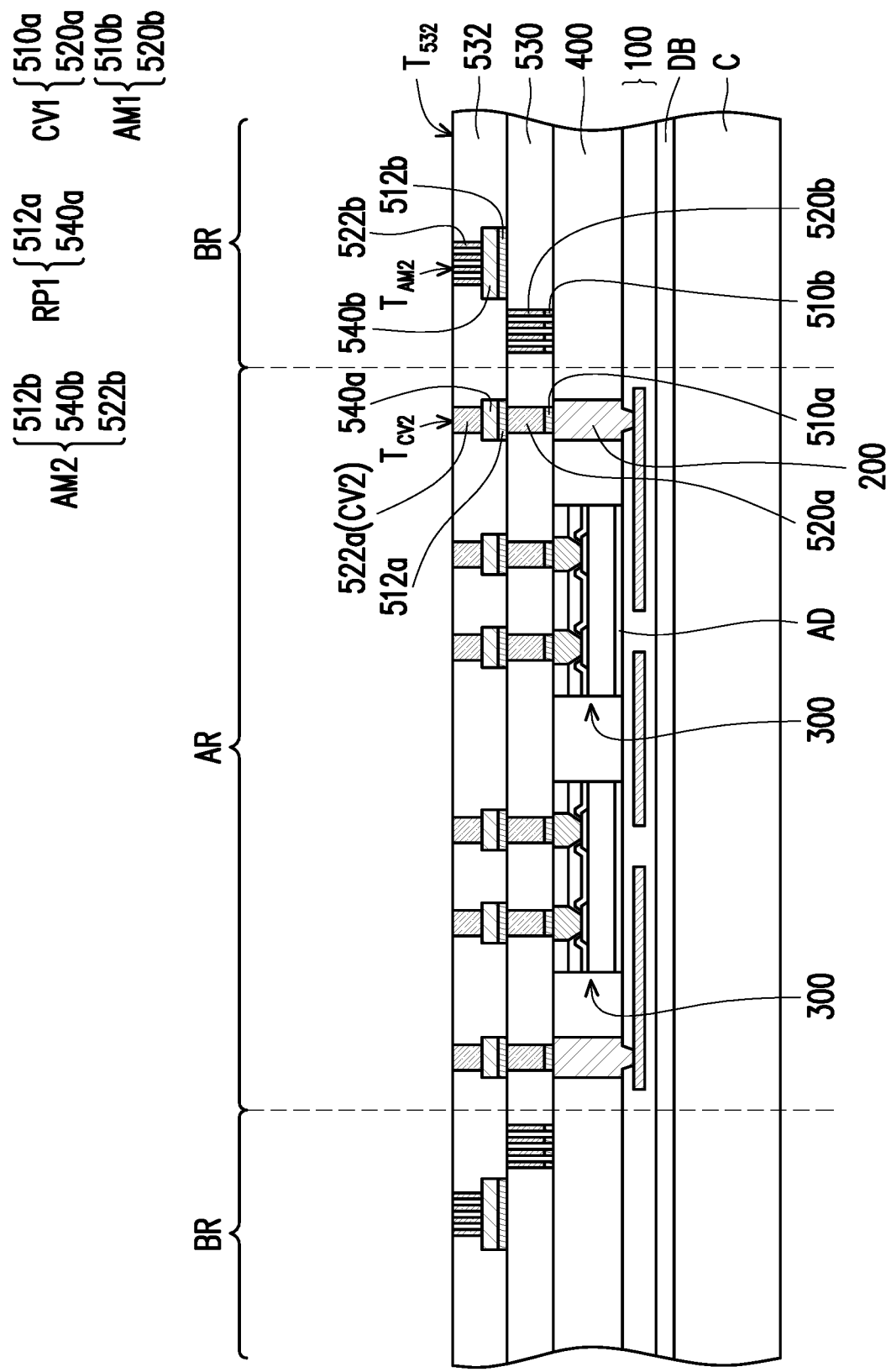
Figure 1S:
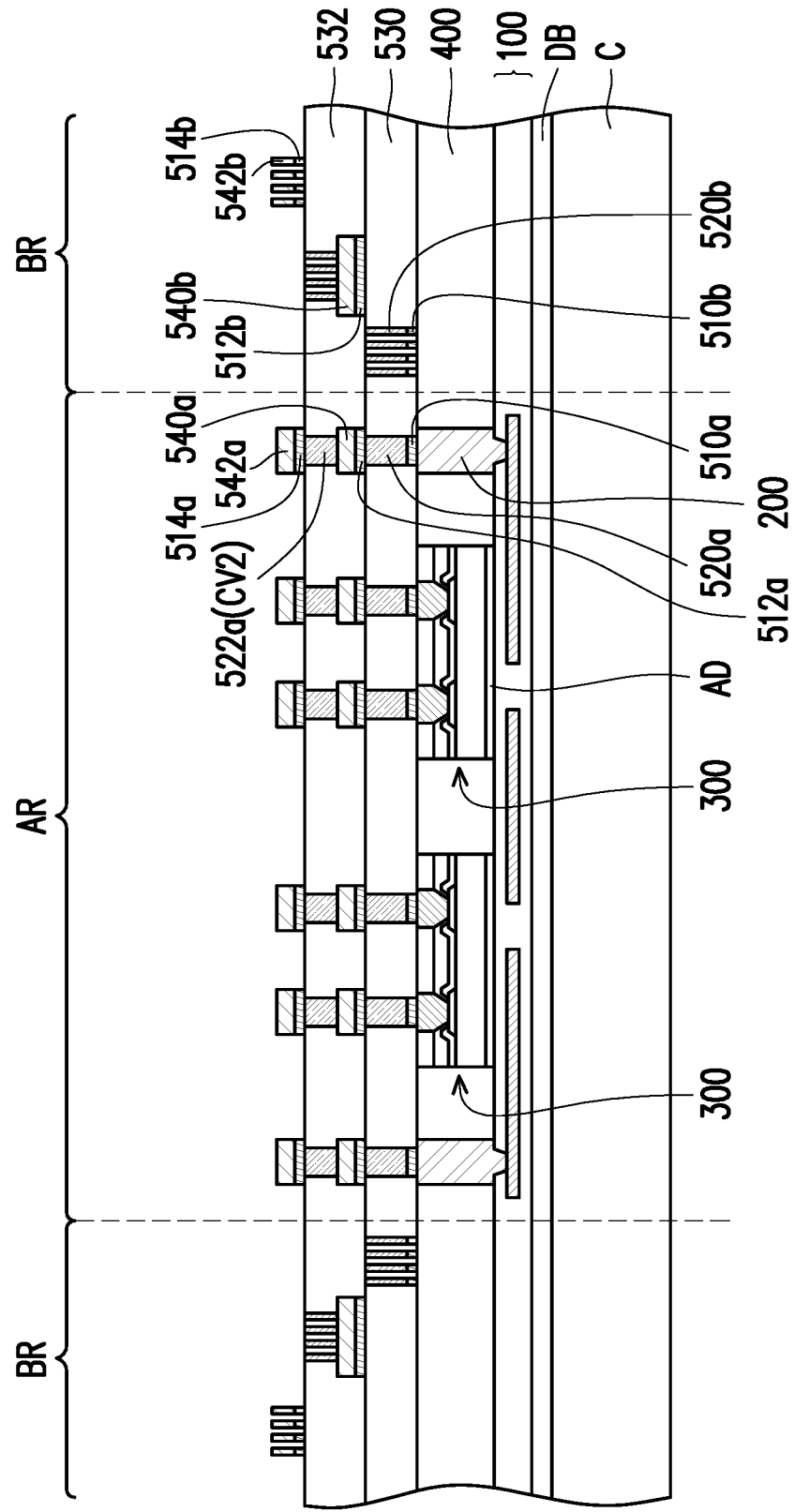
Figure 1T:
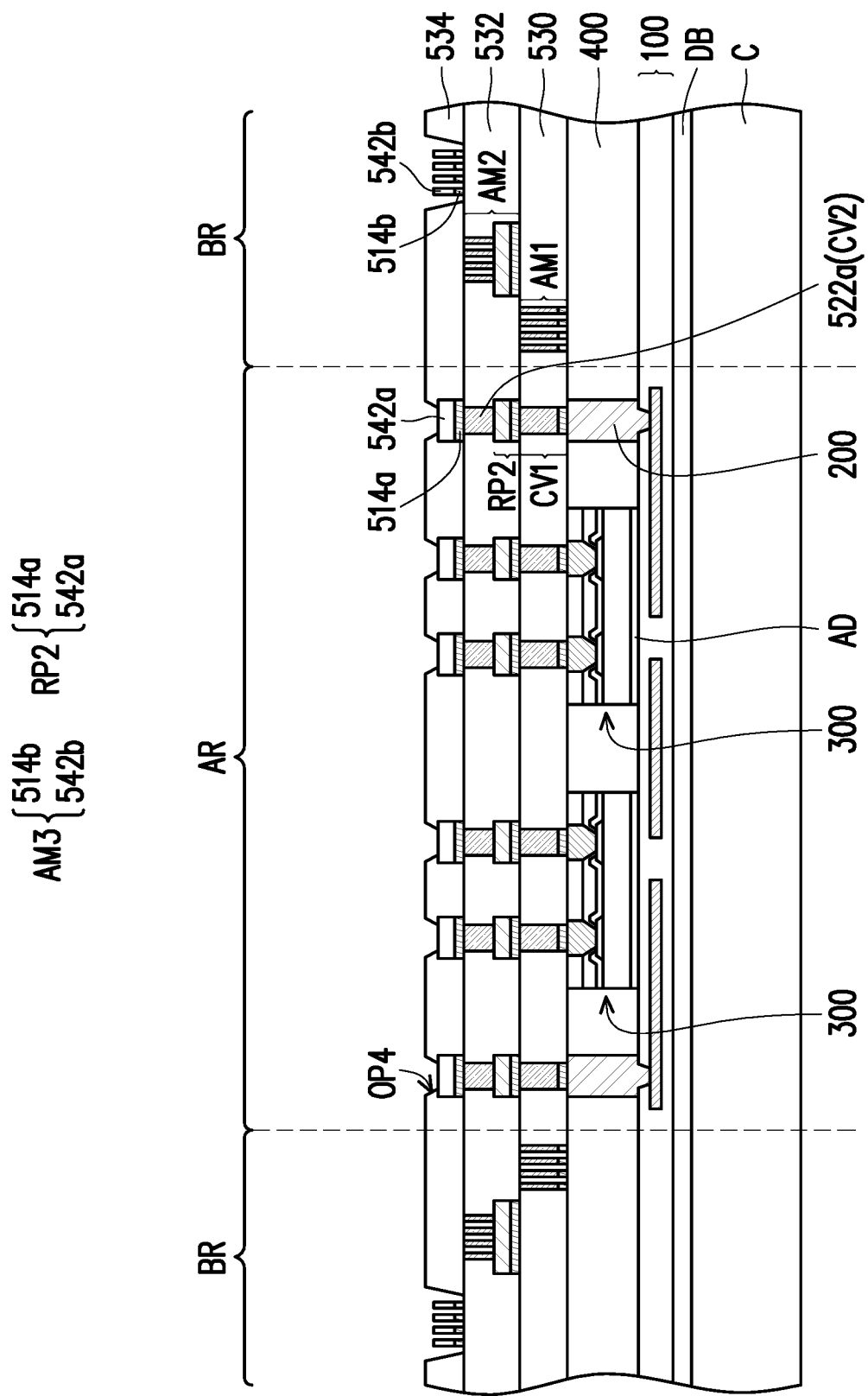
Figure 1U:
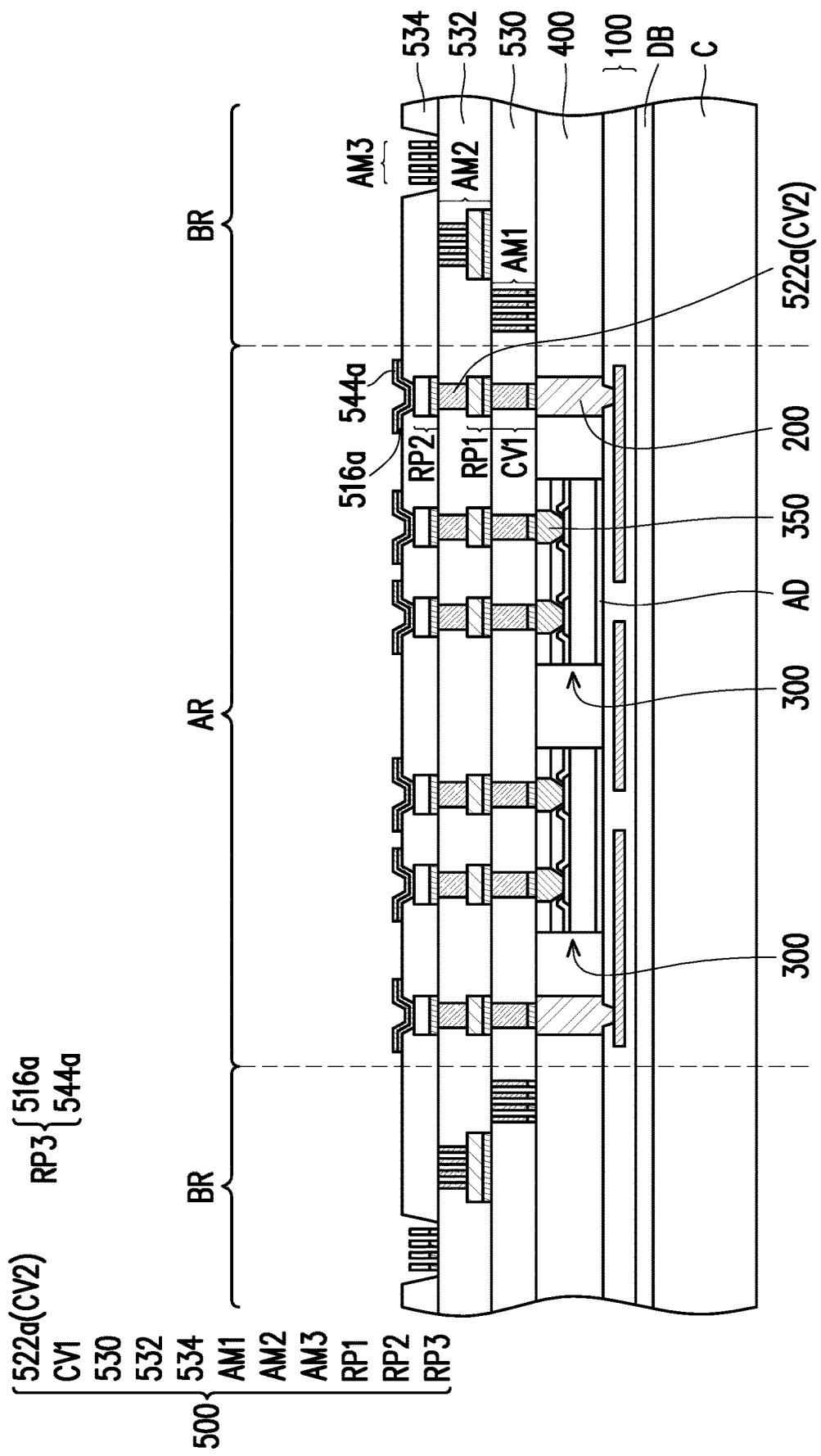
Figure 1V:
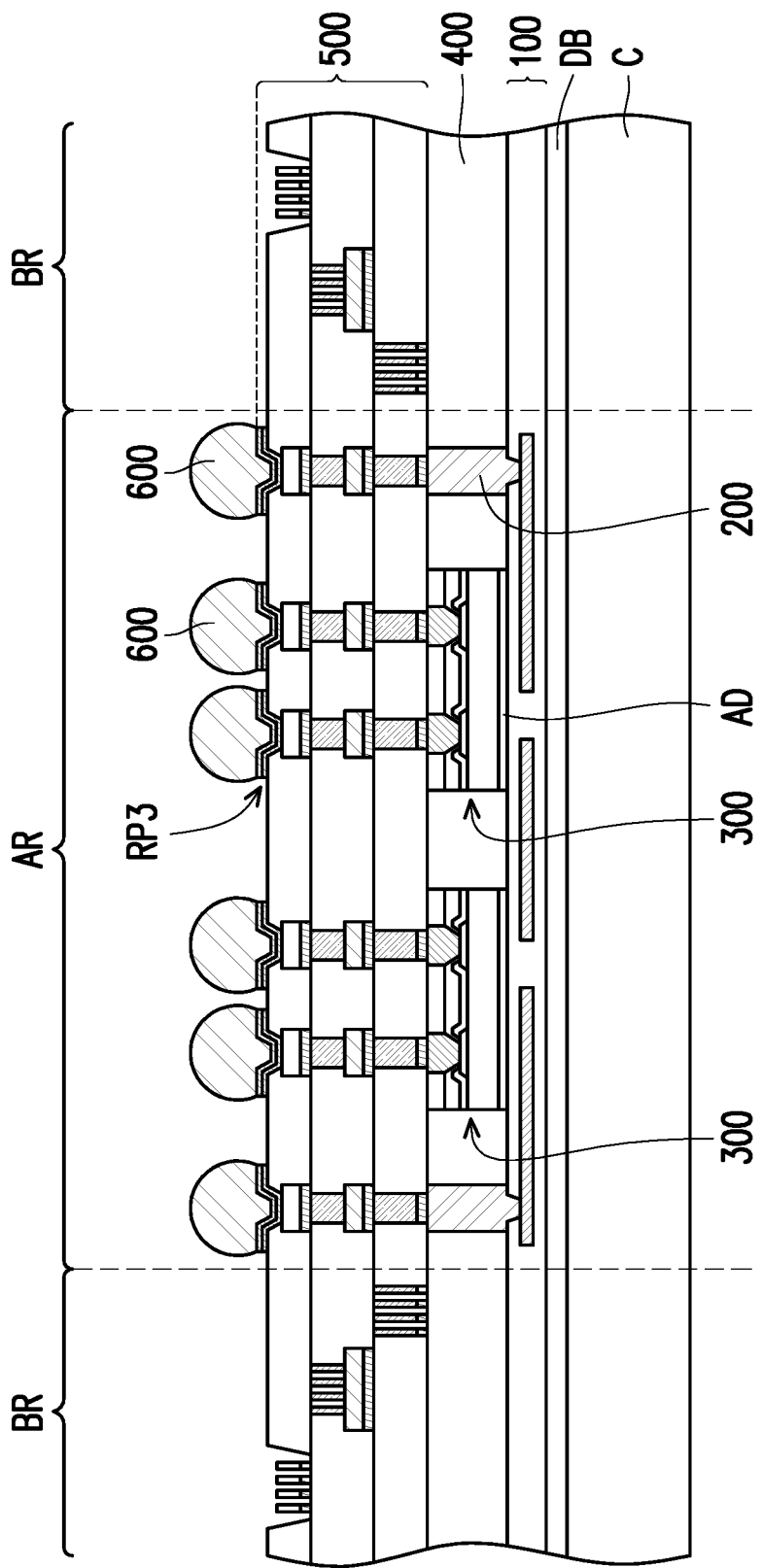
Figure 1W:
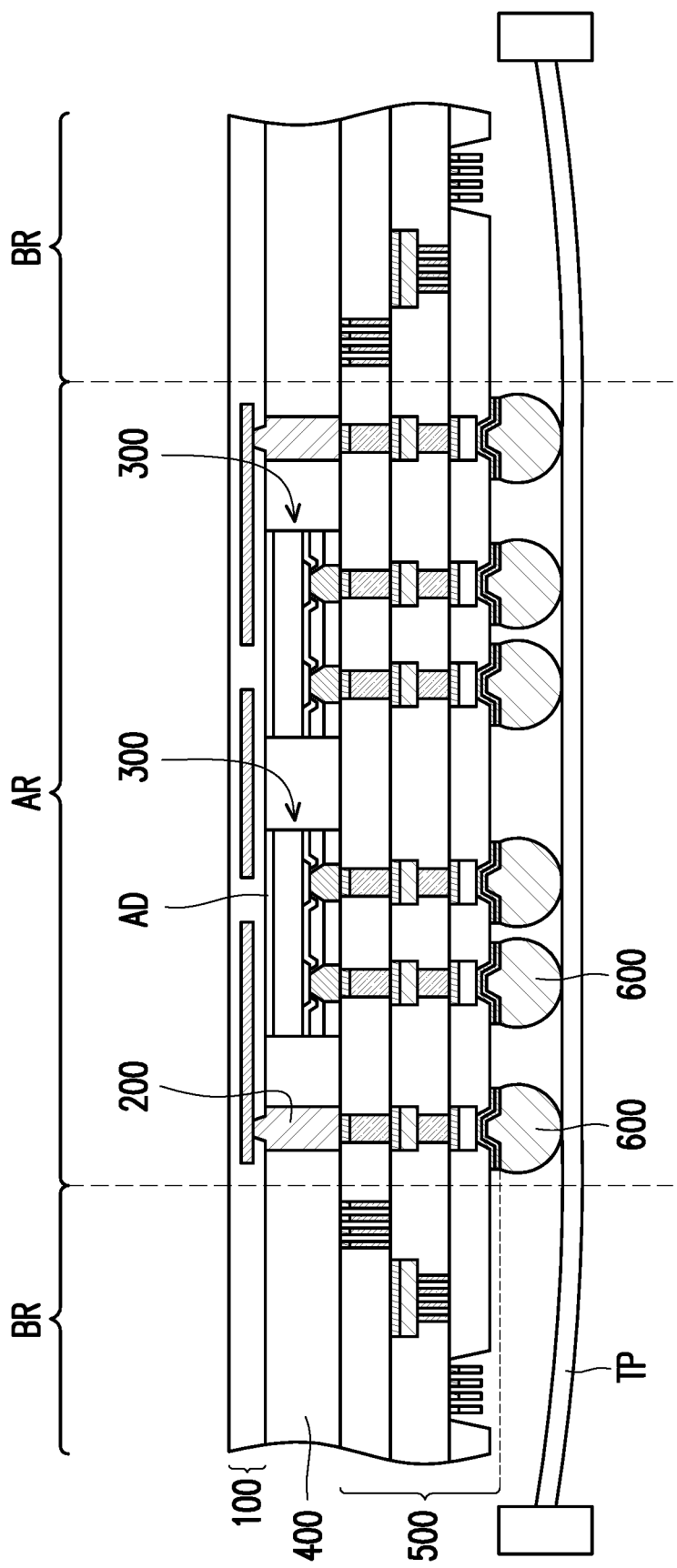
Figure 1X:
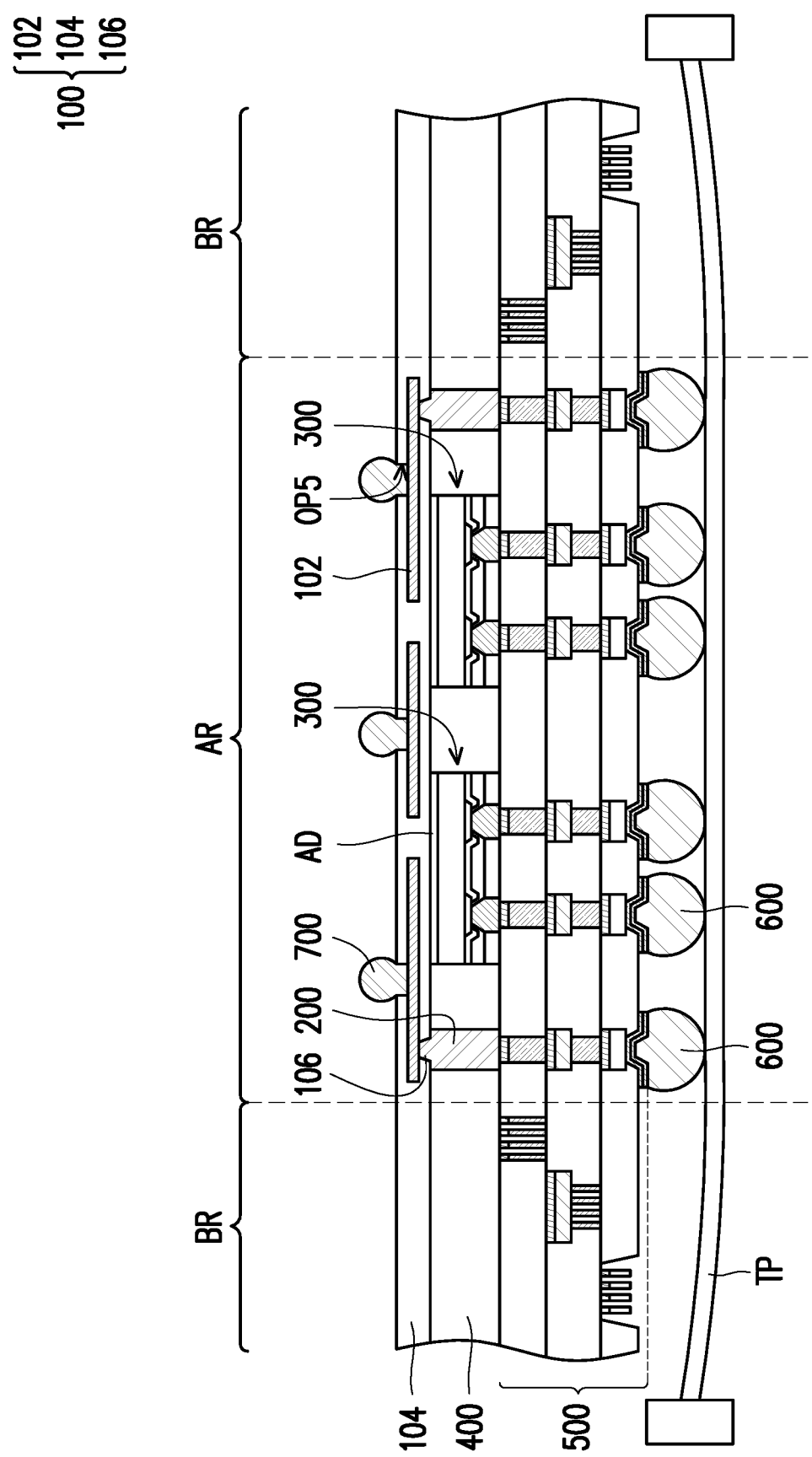
Figure 1Y:
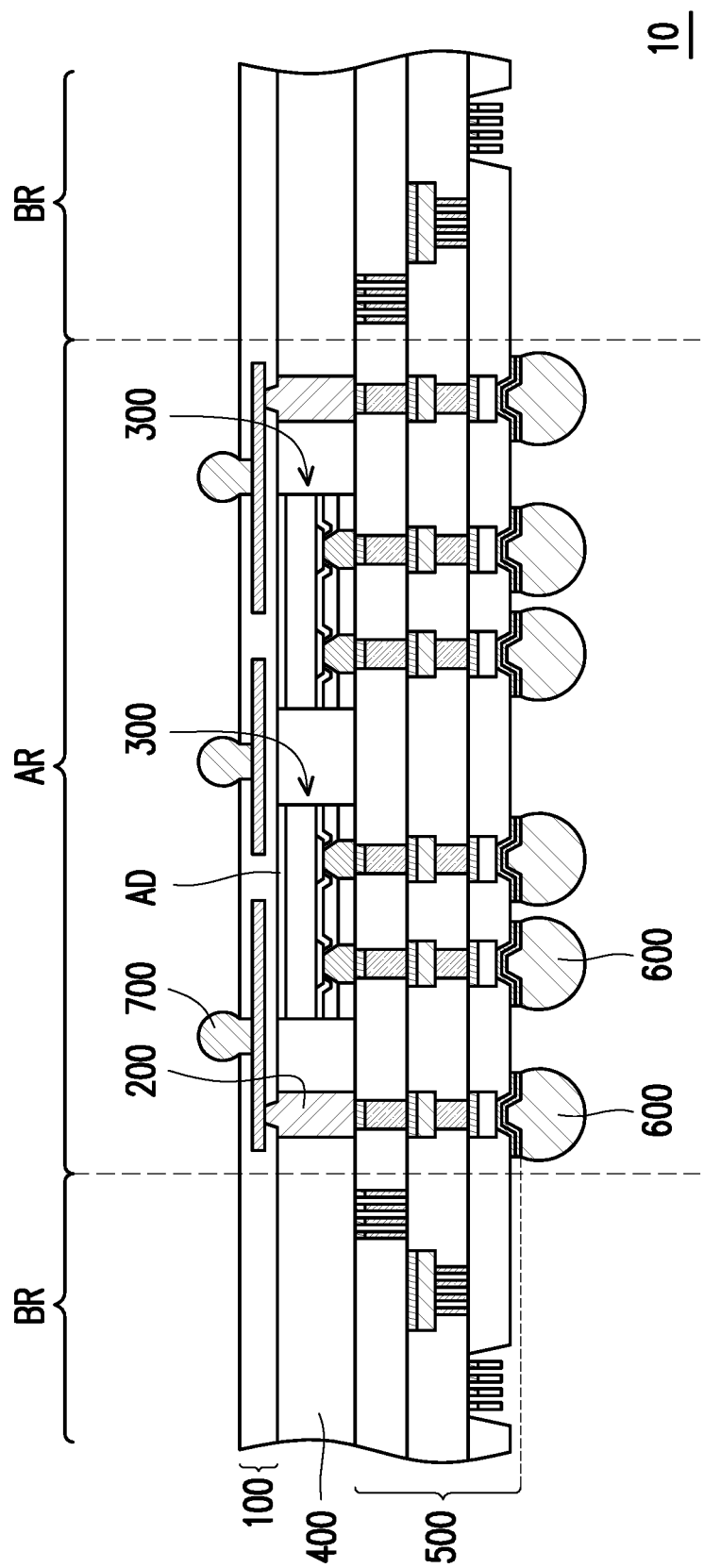

FIG. 1A to FIG. 1Y are schematic cross-sectional views illustrating a manufacturing process of an integrated fan-out (InFO) package 10 in accordance with some embodiments of the disclosure. Referring to FIG. 1A, a carrier C having a de-bonding layer DB formed thereon is provided. In some embodiments, the carrier C is a glass substrate. However, other material may be adapted as a material of the carrier C as long as the material is able to withstand the following manufacturing processes while supporting the elements formed thereon. In some embodiments, the de-bonding layer DB is a light-to-heat conversion (LTHC) release layer formed on the glass substrate. The de-bonding layer DB allows the structure formed on the carrier C in the subsequent processes to be peeled off from the carrier C.

A redistribution structure 100 is formed over the carrier C. In some embodiments, the redistribution structure 100 is attached to the de-bonding layer DB. In some embodiments, the redistribution structure 100 includes a dielectric layer 104, a redistribution conductive layer 102, and a plurality of redistribution conductive vias 106. The redistribution conductive layer 102 may be constituted by a plurality of redistribution conductive patterns. For simplicity, the dielectric layer 104 is illustrated as one single layer of dielectric layer and the redistribution conductive layer 102 is illustrated as embedded in the dielectric layer 104 in FIG. 1A. Nevertheless, from the perspective of the manufacturing process, the dielectric layer 104 is constituted by two dielectric layers and the redistribution conductive layer 102 is sandwiched between the two adjacent dielectric layers. As illustrated in FIG. 1A, the redistribution conductive vias 106 are also embedded in the dielectric layer 104. In some embodiments, materials of the redistribution conductive layer 102 and the redistribution conductive vias 106 include aluminum, titanium, copper, nickel, tungsten, and/or alloys thereof. The redistribution conductive layer 102 may be formed by, for example, electroplating, deposition, and/or photolithography and etching. In some embodiments, the material of the dielectric layer 104 includes polyimide, epoxy resin, acrylic resin, phenol resin, benzocyclobutene (BCB), polybenzooxazole (PBO), or any other suitable polymer-based dielectric material. The dielectric layer 104, for example, may be formed by suitable fabrication techniques such as spin-on coating, chemical vapor deposition (CVD), plasma-enhanced chemical vapor deposition (PECVD), or the like.

It should be noted that the number of the redistribution conductive layers 102 and the number of the dielectric layers 104 illustrated in FIG. 1A are merely for illustrative purposes, and the disclosure is not limited thereto. In some alternative embodiments, more layers of the redistribution conductive layer and more layers of the dielectric layer may be formed depending on the circuit design. When more layers of redistribution conductive layer and more layers of the dielectric layer are adapted, these redistribution conductive layers and these dielectric layers are stacked alternately, and the redistribution conductive layers are interconnected with one another by the redistribution conductive vias. In some embodiments, the redistribution structure 100 is referred to as a back-side redistribution structure.

A plurality of conductive structures 200 are formed on the redistribution structure 100. In some embodiments, the InFO package 10 has an active region AR and a border region BR surrounding the active region AR. The conductive structures 200 may be formed, for example, in the active region AR. In some embodiments, the conductive structures 200 are conductive pillars formed by a photolithography process, a plating process, a photoresist stripping processes, and/or any other suitable processes. In some embodiments, the conductive structures 200 are formed on the redistribution conductive vias 106 and are in contact with the redistribution conductive vias 106 to render electrical connection with the redistribution structure 100. In some embodiments, the conductive structures 200 may be formed simultaneously with the redistribution conductive vias 106 during the same stage. For example, a plurality of contact openings corresponding to the designated location of the redistribution conductive vias 106 may be formed in the dielectric layer 104. Subsequently, a seed material layer (not shown) extending into the contact openings may be formed over the dielectric layer. A mask pattern (not shown) may then be formed on the seed material layer. The mask pattern has openings exposing the seed material layer located inside of the contact openings. In some embodiments, the openings of the mask pattern also exposes portions of the seed material layer in proximity of the contact openings. Thereafter, a conductive material is filled into the openings and the contact openings by electroplating or deposition. Then, the mask pattern and the seed layer underneath the mask pattern is removed to obtain the conductive structures 200 and the redistribution conductive vias 106. However, the disclosure is not limited thereto. Other suitable methods may be utilized to form the conductive structures 102 and the redistribution conductive vias 106. For example, the conductive structures 200 and the redistribution conductive vias 106 may be formed separately. In some alternative embodiments, a plurality of conductive pads (not shown) may be formed over the redistribution conductive vias 106. The conductive structures 200 are formed over the conductive pads such that the conductive structures 200 are electrically connected to the redistribution structure 100 through the conductive pads.

In some embodiments, a material of the conductive structures 200 includes copper, copper alloys, or the like. It should be noted that the number of the conductive structures 200 shown in FIG. 1A merely serves as an exemplary illustration, and the number of the conductive structures 200 may be varied based on demand.

Referring to FIG. 1B, a plurality of dies 300 are formed on the redistribution structure 100. In some embodiments, the dies 300 are placed between the conductive structures 200 in the active region AR. For example, the conductive structures 200 may be arranged to surround the dies 300. In some embodiments, the dies 300 are picked and placed onto the redistribution structure 100. Each of the dies 300, for example, includes a semiconductor substrate 310, a plurality of conductive pads 320, a passivation layer 330, a post passivation layer 340, a plurality of vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxynitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed from the contact openings of the post passivation layer 340. The post-passivation layer 340 may be a polyimide (PI) layer, a PBO layer, or a dielectric layer formed by other suitable polymers. In some embodiments, the post-passivation layer 340 may be optional. In addition, the vias 350 are formed on the conductive pads 320. In some embodiments, the vias 350 are made of conductive materials and are plated on the conductive pads 320. The protection layer 360 is formed on the post-passivation layer 340 to cover the vias 350.

As illustrated in FIG. 1B, each die 300 has a rear surface 300a and a front surface 300b opposite to the rear surface 300a. In some embodiments, the rear surfaces 300a of the dies 300 are attached (or adhered) to the redistribution structure 100 through an adhesive layer AD. In some embodiments, the adhesive layer AD may include a die attach film (DAF). On the other hand, the front surfaces 300b of the dies 300 face upward. As illustrated in FIG. 1B, top surfaces (front surface 300b) of the dies 300 are substantially coplanar with top surfaces of the conductive structures 200. However, the disclosure is not limited thereto. In some alternative embodiments, the top surfaces of the dies 300 may be located at a level height lower than or higher than the top surfaces of the conductive structures 200. Although two dies 300 are shown in FIG. 1B, the configuration merely serves as an exemplary illustration. In some alternative embodiments, more or less number of dies may be formed based on demand.

Referring to FIG. 1C, an encapsulation material 400a is formed over the redistribution structure 100 to encapsulate the conductive structures 200 and the dies 300. For example, the conductive structures 200 and the protection layer 360 of the dies 300 are encapsulated by the encapsulation material 400a. In other words, the conductive structures 200 and the protection layer 360 of the dies 300 are not revealed and are well protected by the encapsulation material 400a. In some embodiments, the encapsulation material 400a is a molding compound, a molding underfill, a resin (such as epoxy), or the like. The encapsulation material 400a may be formed by a molding process. For example, the encapsulation material 400a may be formed by a compression molding process.

Referring to FIG. 1C and FIG. 1D, the encapsulation material 400a and the protection layer 360 of the dies 300 are grinded until top surfaces of the vias 350 are exposed. After the encapsulation material 400a is grinded, an encapsulant 400 is formed over the redistribution structure 100 to encapsulate the conductive structures 200 and the dies 300. In some embodiments, the encapsulant material 400a is grinded by a mechanical grinding process and/or a chemical mechanical polishing (CMP) process. In some embodiments, during the grinding process of the encapsulant material 400a, the protection layer 360 is grinded to reveal the vias 350. In some embodiments, portions of the vias 350 and portions of the conductive structures 200 are slightly grinded as well. After grinding, each die 300 has an active surface 300c and a rear surface 300a opposite to the active surface 300c. The exposed portion of the vias 350 is located on the active surfaces 300c of the dies 300. It is noted that the top surfaces of the conductive structures 200, the top surface of the protection layer 360, and the top surfaces of the vias 350 are substantially coplanar with a top surface of the encapsulant 400.

Referring to FIG. 1E, a seed material layer 510 is formed on the encapsulant 400, the conductive structures 200, and the die 300. In some embodiments, the seed material layer 510 is blanketly formed over the encapsulant 400, the conductive structures 200, and the die 300. For example, the seed material layer 510 is formed to locate in both of the active region AR and the border region BR. In some embodiments, the seed material layer 510 is formed to be in direct contact with the conductive structures 200, the encapsulant 400, the protection layer 360, and the vias 350. The seed material layer 510 may be formed through, for example, a sputtering process, a physical vapor deposition (PVD) process, or the like. In some embodiments, the seed material layer 510 may include, for example, copper, titanium-copper alloy, or other suitable choice of materials.

Referring to FIG. 1F, a photoresist layer PR1 is formed over the seed material layer 510. In some embodiments, the photoresist layer PR1 may be formed through spin-coating or other suitable formation methods. As illustrated in FIG. 1F, the photoresist layer PR1 has a plurality of openings OP1 exposing at least a portion of the seed material layer 510. In some embodiments, two adjacent openings OP1 in the border region BR may be closer than two adjacent openings OP1 in the active region AR. For example, a distance between two adjacent openings OP1 in the border region BR may be smaller than a distance between two adjacent openings OP1 in the active region AR. In some embodiments, some of the openings OP1 in the active region AR correspond to the locations of the conductive structures 200 and the vias 350. For example, a vertical projection of some of the openings OP1 along a direction perpendicular to the active surface 300c of the dies 300 overlaps with the conductive structure 200. Similarly, a vertical projection of some of the openings OP1 along the direction perpendicular to the active surface 300c of the dies 300 overlaps with the vias 350 of the dies 300.

Referring to FIG. 1F and FIG. 1G, a plurality of conductive patterns 520a, 520b are formed on the seed material layer 510. In some embodiments, a conductive material (not shown) is filled into the openings OP1 of the photoresist layer PR1. Thereafter, the photoresist layer PR1 is removed to obtain the conductive patterns 520a, 520b. Upon removal of the photoresist layer PR1, portions of the seed material layer 510, which are not covered by the conductive patterns 520a, 520b, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer PR1 may be removed/stripped through, for example, etching, ashing, or other suitable removal processes. In some embodiments, the conductive patterns 520a are located in the active region AR and the conductive patterns 520b are located in the border region BR.

Referring to FIG. 1G and FIG. 1H, the seed material layer 510 that is not covered by the conductive patterns 520a, 520b is removed to render seed layers 510a, 510b. That is, the seed material layer 510 underneath the photoresist layer PR1 is removed. The exposed portions of the seed material layer 510 may be removed through an etching process. In some embodiments, the material of the conductive patterns 520a, 520b may be different from the material of the seed material layer 510, so the exposed portion of the seed material layer 510 may be removed through selective etching. The seed layer 510a is located in the active region AR and the seed layer 510b is located in the border region BR. In some embodiments, a portion of the seed layer 510a is sandwiched between the conductive structures 200 and the conductive patterns 520a and another portion of the seed layer 510a is sandwiched between the vias 350 and the conductive patterns 520a. On the other hand, the seed layer 510b is sandwiched between the encapsulant 400 and the conductive patterns 520b. In some embodiments, the conductive patterns 520a are stacked on the seed layer 510a, and the conductive patterns 520b are stacked on the seed layer 510b. In some embodiments, the seed layer 510b may include a plurality of seed layer patterns. As illustrated in FIG. 1H, the seed layer patterns are aligned with the conductive patterns 520b along a direction perpendicular to the active surface 300c of the die 300. For example, sidewalls of each seed layer pattern are aligned with sidewalls of each conductive pattern 520b.

In some embodiments, the conductive patterns 520a and the seed layer 510a located in the active region AR are collectively referred to as first conductive vias CV1. On the other hand, the conductive patterns 520b and the seed layer 510b located in the border region BR may be collectively referred to as first alignment marks AM1. In some embodiments, the first conductive vias CV1 are located in the active region AR and the first alignment marks AM1 are located in the border region BR. The first conductive vias CV1 may electrically connect the conductive structures 200 and/or the vias 350 of the die 300 with other subsequently formed elements. On the other hand, the first alignment marks AM1 may ensure other subsequently formed elements are precisely formed on the designated location. In some embodiments, the first alignment marks AM1 are electrically floating. For example, the first alignment marks AM1 are electrically insulated from the first conductive vias CV1, the conductive structures 200, the vias 350 of the dies 300, and the redistribution structure 100. In some embodiments, the first alignment marks AM1 are in physical contact with the encapsulant 400. For example, the seed layer 510b of the first alignment marks AM1 may be directly in contact with the encapsulant 400.

As mentioned above, the distance between two adjacent openings OP1 of the photoresist layer PR1 in the border region BR may be smaller than the distance between two adjacent openings OP1 of the photoresist layer PR1 in the active region AR. Since the first conductive vias CV1 and the first alignment marks AM1 are formed by filling the conductive material into the openings OP1, the first conductive vias CV1 and the first alignment marks AM1 may have shapes corresponding to the contour of the openings OP1. For example, each of the first conductive vias CV1 may be a bulk pattern from a top view while each of the first alignment marks AM1 may be a grid pattern from a top view. That is, one first conductive via CV1 includes one conductive pattern 520a while one first alignment mark AM1 includes multiple conductive patterns 520b. The configuration of the first alignment mark AM1 will be discussed below in conjunction with FIG. 2A to FIG. 2C.

Figure 2C:
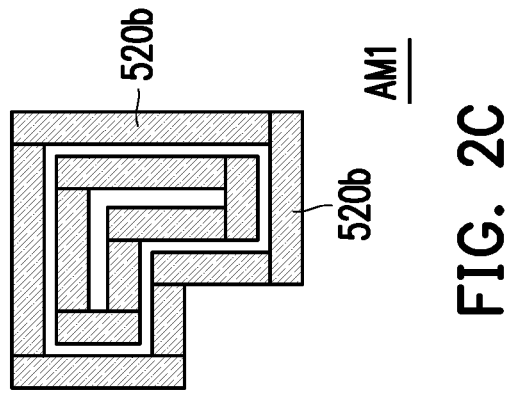
FIG. 2A to FIG. 2C are schematic top views illustrating various configurations of the first alignment mark in FIG. 1H.
Figure 2B:
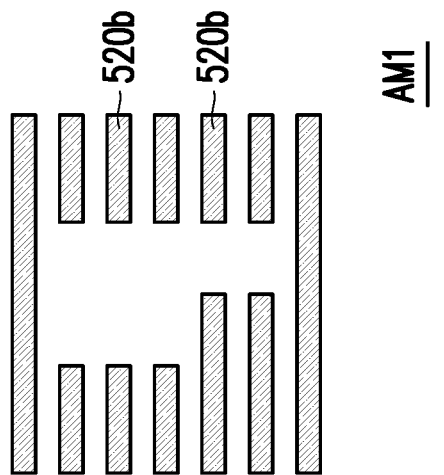
Figure 2A:
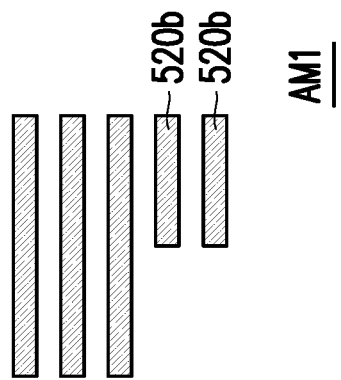

FIG. 2A to FIG. 2C are schematic top views illustrating various configurations of the first alignment mark in FIG. 1H. Referring to FIG. 2A, the conductive patterns 520b are arranged parallel to each other. Moreover, the conductive patterns 520b are separated from each other. That is, the conductive patterns 520b are arranged to form an L-shaped grid pattern. In some embodiments, the first alignment mark AM1 has a dimension of 1 μm to 20 μm. Herein, the dimension refers to the length or the width of the first alignment mark AM1 from the top view. By adapting the first alignment mark AM1 with the grid pattern, the signal noise on the first alignment mark AM1 may be sufficiently reduced. That is, the machinery is able to precisely detect the first alignment mark AM1, thereby enhancing the overlay accuracy and reducing the alignment failure rate. For example, in some embodiments, an overlay accuracy within 0.5 μm may be achieved through the adaption of the grid pattern.

In some alternative embodiments, the first alignment mark AM1 may have other shapes from the top view. For example, referring to FIG. 2B, the conductive patterns 520b form a square-shaped grid pattern. The square-shaped grid pattern has an L-shaped hollow portion therein. In some embodiments, the machinery may detect the contour of the L-shaped hollow portion based on the conductive patterns 520b for alignment. FIG. 2A and FIG. 2B illustrated that all of the conductive patterns 520b in the first alignment mark AM1 are separated from each other, but the disclosure is not limited thereto. In some alternative embodiments, at least a portion of the conductive patterns 520b may be in contact with each other. For example, referring to FIG. 2C, a portion of the conductive patterns 520b are connected to each other to form a first L-shaped pattern. On the other hand, another portion of the conductive patterns 520b are connected to each other to form a second L-shaped pattern encircling the first L-shaped pattern. The conductive patterns 520b in the first L-shaped pattern are separated from the conductive patterns 520b in the second L-shaped pattern. Since at least part of the conductive patterns 520b are separated from each other, the configuration shown in FIG. 2C may also be considered as a grid pattern in some embodiments. By adapting the first alignment mark AM1 with the grid pattern, the signal noise on the first alignment mark AM1 may be sufficiently reduced and the overlay accuracy may be sufficiently enhanced.

It should be noted that the configurations of the first alignment mark AM1 shown in FIG. 2A to FIG. 2C merely serve as exemplary illustrations, and the disclosure is not limited thereto. The first alignment mark AM1 may also have other shapes or take other forms as long as the first alignment mark AM1 includes a grid pattern.

Referring to FIG. 1I, a dielectric material layer 530a is formed over the encapsulant 400, the conductive structures 200, and the dies 300 to encapsulate the first conductive vias CV1 and the first alignment marks AM1. In other words, the first conductive vias CV1 and the first alignment marks AM1 are not revealed and are well protected by the dielectric material layer 530a. In some embodiments, a material of the dielectric material layer 530a includes polyimide, epoxy resin, acrylic resin, phenol resin, BCB, PBO, or any other suitable polymer-based dielectric material. The dielectric material layer 530a may be formed by suitable fabrication techniques, such as spin-on coating, chemical vapor deposition (CVD), plasma-enhanced chemical vapor deposition (PECVD), or the like.

Referring to FIG. 1I and FIG. 1J, a portion of the dielectric material layer 530a is removed to form a first dielectric layer 530 exposing top surfaces $T_{CV1}$ of the first conductive vias CV1 and top surfaces $T_{AM1}$ of the first alignment marks AM1. For example, the dielectric material layer 530a may be grinded until top surfaces $T_{CV1}$ of the first conductive vias CV1 and top surfaces $T_{AM1}$ of the first alignment marks AM1 are exposed. In some embodiments, the dielectric material layer 530a is grinded by a chemical mechanical polishing (CMP) process.

In some embodiments, the dielectric material layer 530a is grinded such that a top surface $T_{530}$ of the first dielectric layer 530 is substantially coplanar with the top surfaces $T_{CV1}$ of the first conductive vias CV1 and the top surfaces TAMI of the first alignment marks AM1. For example, the top surfaces $T_{CV1}$ of the first conductive vias CV1 are substantially coplanar with top surfaces of the conductive patterns 520b of the first alignment mark AM1. In some embodiments, the first dielectric layer 530, the first conductive vias CV1, and the first alignment marks AM1 may have substantially the same thickness of 2 μm to 10 μm. In some alternative embodiments, due to grinding selectivity between different materials, a height difference may be seen between the top surface $T_{530}$ of the first dielectric layer 530 and the top surfaces $T_{CV1}$ of the first conductive vias CV1 and between the top surface $T_{530}$ of the first dielectric layer 530 and the top surfaces $T_{AM1}$ of the first alignment marks AM1. The height differences will be described below in conjunction with FIG. 3A and FIG. 3B.

Figure 3A:
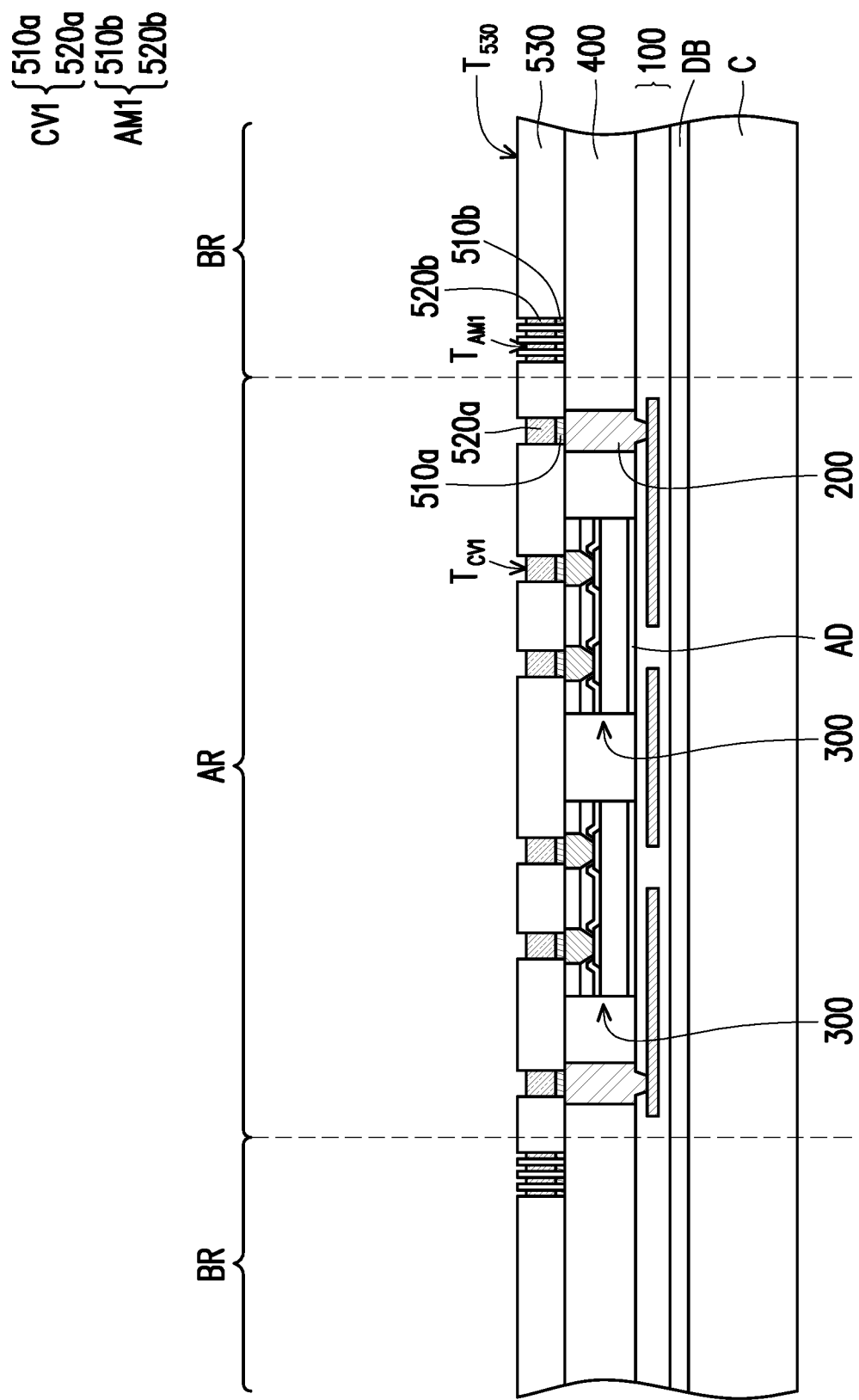
FIG. 3A to FIG. 3B are schematic cross-sectional views illustrating an intermediate stage of a manufacturing process of an InFO package in accordance with some alternative embodiments of the disclosure.
Figure 3B:
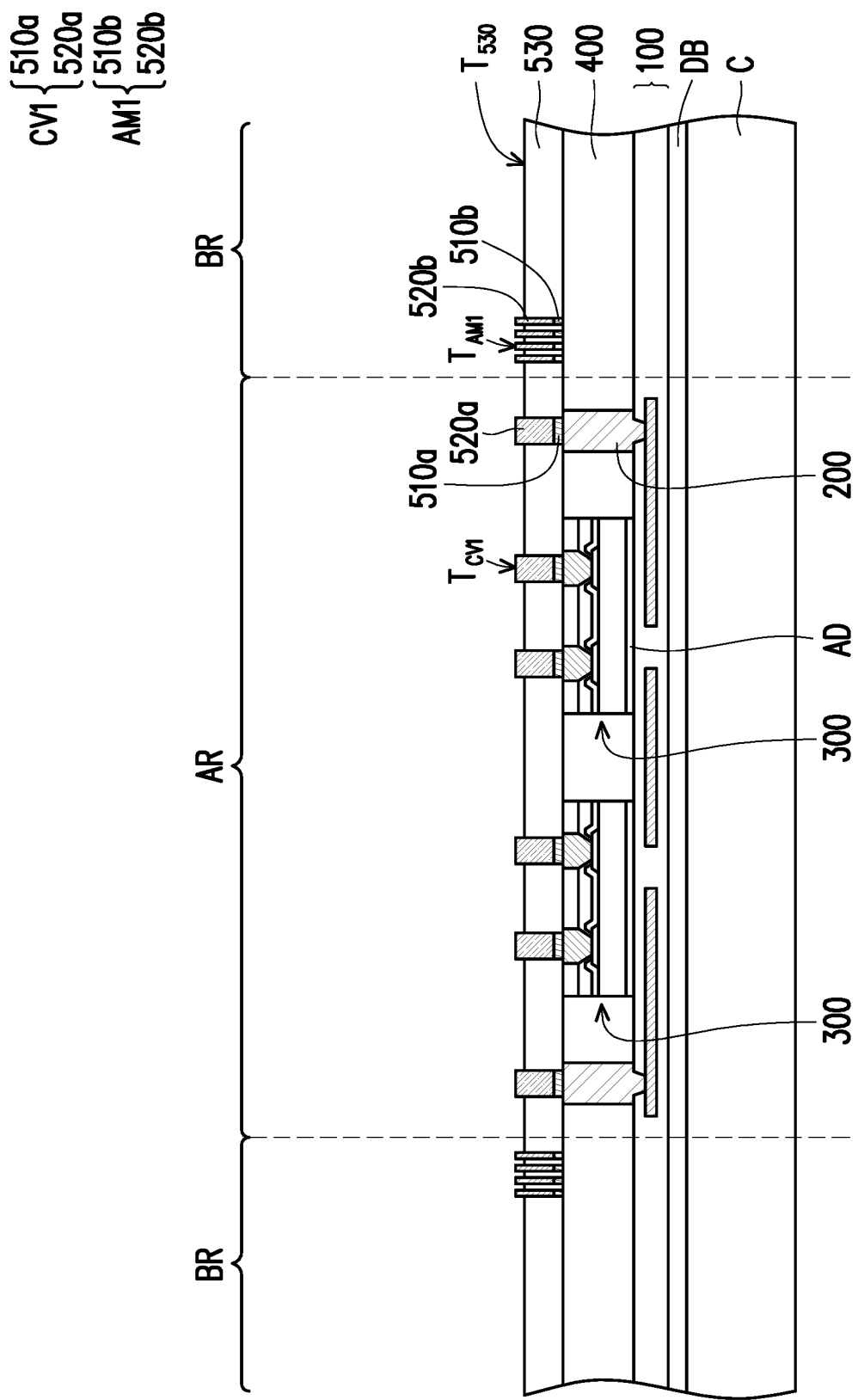

FIG. 3A to FIG. 3B are schematic cross-sectional views illustrating an intermediate stage of a manufacturing process of an InFO package 10 in accordance with some alternative embodiments of the disclosure. Referring to FIG. 3A, in some embodiments, the conductive vias CV1 and the first alignment marks AM1 are over-grinded during the grinding process such that the top surface $T_{530}$ of the first dielectric layer 530 is located at a level height higher than the top surfaces $T_{CV1}$ of the first conductive vias CV1 and the top surfaces $T_{AM1}$ of the first alignment marks AM1. For example, a thickness of the first conductive vias CV1 may be smaller than a thickness of the first dielectric layer 530. Similarly, a thickness of the first alignment mark AM1 may also be smaller than the thickness of the first dielectric layer 530. Referring to FIG. 3B, in some alternative embodiments, the first dielectric layer 530 may be over-grinded during the grinding process such that the top surfaces $T_{CV1}$ of the first conductive vias CV1 and the top surfaces $T_{AM1}$ of the first alignment marks AM1 are located at a level height higher than the top surface $T_{530}$ of the first dielectric layer 530. For example, the thickness of the first conductive vias CV1 and the thickness of the first alignment marks AM1 are both larger than the thickness of the first dielectric layer 530. In some embodiments, the first conductive vias CV1 and the first alignment marks AM1 protrude from the top surface $T_{530}$ of the first dielectric layer 530.

However, since the first dielectric layer 530 is formed by the grinding-back method, the height difference is negligible. For example, a distance between the top surfaces $T_{530}$ of the first dielectric layer 530 and the top surfaces $T_{CV1}$ of the first conductive vias CV1 (the height difference) is less than 0.6 m. Similarly, a distance between the top surfaces $T_{530}$ of the first dielectric layer 530 and the top surfaces $T_{AM1}$ of the first alignment mark AM1 (the height difference) is also less than 0.6 μm.

Referring back to FIG. 1J, in some embodiments, after the top surfaces $T_{CV1}$ of the first conductive via CV1 and the top surfaces $T_{AM1}$ of the first alignment mark AM1 are exposed, these surfaces are further grinded to render a smooth profile. For example, a roughness of the top surfaces $T_{CV1}$ of the first conductive vias CV1 ranges between 0.04 μm and 0.09 μm. Similarly, a roughness of the top surfaces $T_{AM1}$ of the first alignment mark AM1 also ranges between 0.04 μm and 0.09 μm. Since the first alignment marks AM1 have smooth top surfaces $T_{AM1}$ and the top surfaces $T_{AM1}$ of the first alignment marks AM1 are substantially coplanar with the top surface $T_{530}$ of the first dielectric layer 530 adjacent thereto, better resolution of the first alignment marks AM1 may be obtained by the machinery during the exposure/alignment process. As such, the subsequently formed elements may be accurately formed on the designated location, thereby enhancing the reliability of the InFO package 10.

In some embodiments, the first conductive vias CV1, the first alignment mark AM1, and the first dielectric layer 530 may constitute a first sub-layer of a subsequently formed redistribution structure 500 (shown in FIG. 1T). As illustrated in FIG. 1J, the first sub-layer is formed over the encapsulant 400, the dies 300, and the conductive structures 200. The first dielectric layer 530 wraps around the first conductive vias CV1 and the first alignment marks AM1. That is, the first conductive vias CV1 and the first alignment marks AM1 are embedded in the first dielectric layer 530. Referring to FIG. 1J, since the first dielectric layer 530 wraps around sidewalls of the first alignment marks AM1, the first dielectric layer 530 is able to protect the sidewalls of the first alignment marks AM1 from being damaged by the subsequent processes (i.e. etching process or the like). That is, in some embodiments, each of the first alignment marks AM1 has substantially straight sidewalls. For example, an included angle formed between the sidewalls of the first alignment mark AM1 and a virtual line extending along a direction perpendicular to the top surface $T_{AM1}$ of the first alignment mark AM1 may range between 85° and 90°.

Referring to FIG. 1K, a seed material layer 512 is formed over the first sub-layer. The seed material layer 512 may be similar to the seed material layer 510, so the detailed descriptions thereof are omitted herein. In some embodiments, the seed material layer 512 is blanketly formed to be in direct contact with the first dielectric layer 530, the first conductive vias CV1, and the first alignment mark AM1. The seed material layer 512 is formed to locate in both of the active region AR and the border region BR.

Referring to FIG. 1L, a photoresist layer PR2 is formed over the seed material layer 512. In some embodiments, the photoresist layer PR2 may be formed through spin-coating or other suitable formation methods. As illustrated in FIG. 1L, the photoresist layer PR2 has a plurality of openings OP2 exposing at least a portion of the seed material layer 512. In some embodiments, the precision of the locations of the openings OP2 may be ensured by using the first alignment mark AM1 as an alignment tool. In some embodiments, the openings OP2 in the active region AR correspond to the locations of the first conductive vias CV1. For example, a vertical projection of the openings OP2 in the active region AR along the direction perpendicular to the active surface 300c of the dies 300 overlaps with the first conductive vias CV1. On the other hand, the openings OP2 in the border region BR does not correspond to the locations of the first alignment marks AM1. For example, a vertical projection of the openings OP2 in the border region BR along the direction perpendicular to the active surface 300c of the dies 300 does not overlap with the first alignment marks AM1.

Referring to FIG. 1L and FIG. 1M, a plurality of conductive patterns 540a, 540b are formed on the seed material layer 512. In some embodiments, a conductive material (not shown) is filled into the openings OP2 of the photoresist layer PR2. Thereafter, the photoresist layer PR2 is removed to obtain the conductive patterns 540a, 540b. Upon removal of the photoresist layer PR2, portions of the seed material layer 512, which are not covered by the conductive patterns 540a, 540b, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer PR2 may be removed/stripped through, for example, etching, ashing, or other suitable removal processes. In some embodiments, the conductive patterns 540a are located in the active region AR and the conductive patterns 540b are located in the border region BR.

Referring to FIG. 1N, a photoresist layer PR3 is formed over the seed material layer 512 and the conductive patterns 540a, 540b. In some embodiments, the photoresist layer PR3 may be formed through spin-coating or other suitable formation methods. As illustrated in FIG. 1N, the photoresist layer PR3 has a plurality of openings OP3 exposing at least a portion of the conductive patterns 540a, 540b. In some embodiments, the precision of the locations of the openings OP3 may be ensured by using the first alignment mark AM1 as an alignment tool. In some embodiments, two adjacent openings OP3 in the border region BR may be closer than two adjacent openings OP3 in the active region AR. For example, a distance between two adjacent openings OP3 above the conductive patterns 540b may be smaller than a distance between two adjacent openings OP3 above the conductive patterns 540a. In some embodiments, multiple openings OP3 in the border region BR exposes the same conductive pattern 540b while each of the openings OP3 in the active region AR exposes different conductive patterns 540a.

Referring to FIG. 1N and FIG. 1O, a plurality of conductive patterns 522a and a plurality of conductive patterns 522b are respectively formed on the conductive patterns 540a and the conductive patterns 540b. In some embodiments, a conductive material (not shown) is filled into the openings OP3 of the photoresist layer PR3. Thereafter, the photoresist layer PR3 is removed to obtain the conductive patterns 522a, 522b. In some embodiments, the conductive material may be formed by a plating process. The plating process is, for example, electro-plating, electroless-plating, immersion plating, or the like. In some embodiments, the conductive material includes, for example, copper, copper alloys, or the like. In some embodiments, the plating process of the conductive patterns 522a, 522b shares the same seed layer with the plating process of the conductive patterns 540a, 540b. That is, the seed material layer 512 may be utilized as a seed layer for plating for both of the conductive patterns 540a, 540b and the conductive patterns 522a, 522b. As a result, the conductive patterns 522a and the conductive patterns 522b are free of seed layer. That is, no seed layer exists between the conductive patterns 522a and the conductive patterns 540a and no seed layer exists between the conductive patterns 522b and the conductive patterns 540b. The photoresist pattern layer PR3 may be removed/stripped through, for example, etching, ashing, or other suitable removal processes. In some embodiments, the conductive patterns 522a are located in the active region AR and the conductive patterns 522b are located in the border region BR.

Referring to FIG. 1O and FIG. 1P, the seed material layer 512 that is not covered by the conductive patterns 540a, 540b is removed to render seed layers 512a, 512b. The seed layer 512a is located in the active region AR and the seed layer 512b is located in the border region BR. In some embodiments, the seed layer 512a is sandwiched between the first conductive vias CV1 and the conductive patterns 540a. On the other hand, the seed layer 512b is sandwiched between the first dielectric layer 530 and the conductive patterns 540b. Moreover, the conductive patterns 540a is sandwiched between the conductive patterns 522a and the seed layer 512a, and the conductive patterns 540b is sandwiched between the conductive patterns 522b and the seed layer 512b. The exposed portions of the seed material layer 512 may be removed through an etching process. In some embodiments, the material of the conductive patterns 522a, 522b, 540a, 540b may be different from the material of the seed material layer 512, so the exposed portion of the seed material layer 512 may be removed through selective etching.

In some embodiments, the conductive patterns 540a and the seed layer 512a located in the active region AR are collectively referred to as first routing patterns RP1. In some embodiments, the conductive patterns 522a located in the active region AR may be referred to as second conductive vias CV2. On the other hand, the conductive patterns 522b, the conductive patterns 540b, and the seed layer 512b located in the border region BR may be collectively referred to as second alignment marks AM2. In some embodiments, the first routing pattern RP1 and the second conductive vias CV2 are located in the active region AR. On the other hand, the second alignment marks AM2 are located in the border region BR. The first routing patterns RP1 may include routing traces for signal transmission along the horizontal plane. The second conductive vias CV2 may electrically connect the first routing patterns RP1 with other subsequently formed elements. On the other hand, the second alignment marks AM2 may ensure other subsequently formed elements are precisely formed on the designated location. In some embodiments, the second alignment marks AM2 are electrically floating. For example, the second alignment marks AM2 are electrically insulated from the first routing patterns RP1, the second conductive vias CV2, the first alignment mark AM1, the first conductive vias CV1, the conductive structures 200, the vias 350 of the dies 300, and the redistribution structure 100. In some embodiments, the second alignment marks AM2 are in physical contact with the first dielectric layer 530. For example, the seed layer 512b of the second alignment marks AM2 may be directly in contact with the first dielectric layer 530. In some embodiments, the second alignment marks AM2 are not overlapped with the first alignment marks AM1. For example, a vertical projection of the second alignment marks AM2 along the direction perpendicular to the active surface 300c of the dies 300 does not overlap with the first alignment marks AM1. Unlike the first alignment marks AM1 being a dual-layered structure, the second alignment mark AM2 may be a triple-layered structure. In some embodiments, each first alignment mark AM1 includes multiple conductive patterns 520b stacked on top of multiple seed layer patterns (seed layer 510b). As illustrated in FIG. 1P, the conductive patterns 520b are separated from each other, and the seed layer patterns are also separated from each other. On the other hand, each first alignment mark AM2 includes multiple conductive patterns 522b stacked on top of a continuous conductive pattern 540b and a continuous seed layer 512b.

As mentioned above, the distance between two adjacent openings OP3 above the conductive patterns 540b may be smaller than the distance between two adjacent openings OP3 above the conductive patterns 540a. Since the second conductive vias CV2 and the second alignment marks AM2 are formed by filling the conductive material into the openings OP3, the second conductive vias CV2 and the second alignment marks AM2 may have shapes corresponding to the contour of the openings OP3. For example, each of the second conductive vias CV2 may be a bulk pattern from a top view while each of the second alignment marks AM2 may be a grid pattern from a top view. That is, one second conductive via CV2 includes one conductive pattern 522a while one second alignment mark AM2 includes multiple conductive patterns 522b. It should be noted that the second alignment marks AM2 may also adapt the configurations illustrated in FIG. 2A to FIG. 2C.

Referring to FIG. 1Q, a dielectric material layer 532a is formed over the first dielectric layer 530, the first conductive vias CV1, and the first alignment marks AM1 to encapsulate the first routing patterns RP1, the second conductive vias CV2, and the second alignment marks AM2. In other words, the first routing patterns RP1, the second conductive vias CV2, and the second alignment marks AM2 are not revealed and are well protected by the dielectric material layer 532a. The dielectric material layer 532a may be similar to the dielectric material layer 530a, so the detailed descriptions thereof are omitted herein.

Referring to FIG. 1Q and FIG. 1R, a portion of the dielectric material layer 532a is removed to form a second dielectric layer 530 exposing top surfaces $T_{CV2}$ of the second conductive vias CV2 and top surfaces $T_{AM2}$ of the second alignment marks AM2. For example, the dielectric material layer 532a may be grinded until top surfaces $T_{CV2}$ of the second conductive vias CV2 and top surfaces $T_{AM2}$ of the second alignment marks AM2 are exposed. In some embodiments, the dielectric material layer 532a is grinded by a chemical mechanical polishing (CMP) process. As illustrated in FIG. 1R, the second dielectric layer 532 is stacked over the first dielectric layer 530.

In some embodiments, the dielectric material layer 532a is grinded such that a top surface $T_{532}$ of the first dielectric layer 532 is substantially coplanar with the top surfaces $T_{CV2}$ of the second conductive vias CV2 and the top surfaces $T_{AM2}$ of the second alignment marks AM2. For example, the top surfaces $T_{CV2}$ of the second conductive vias CV2 are substantially coplanar with top surfaces of the conductive patterns 522b. In some alternative embodiments, due to grinding selectivity between different materials, a height difference may be seen between the top surface $T_{532}$ of the second dielectric layer 532 and the top surfaces $T_{CV2}$ of the second conductive vias CV2 and between the top surface $T_{532}$ of the second dielectric layer 532 and the top surfaces $T_{AM2}$ of the second alignment marks AM2. However, since the second dielectric layer 532 is formed by the grinding-back method, the height difference is negligible. For example, a distance between the top surfaces $T_{532}$ of the second dielectric layer 532 and the top surfaces $T_{CV2}$ of the second conductive vias CV2 (the height difference) is less than 0.6 μm. Similarly, a distance between the top surfaces $T_{532}$ of the second dielectric layer 532 and the top surfaces $T_{AM2}$ of the second alignment marks AM2 (the height difference) is also less than 0.6 µm.

In some embodiments, after the top surfaces $T_{CV2}$ of the second conductive vias CV2 and the top surfaces $T_{AM2}$ of the second alignment mark AM2 are exposed, these surfaces are further grinded to render a smooth profile. For example, a roughness of the top surfaces $T_{CV2}$ of the second conductive vias CV2 ranges between 0.04 µm and 0.09 m. Similarly, a roughness of the top surfaces $T_{AM2}$ of the second alignment mark AM2 also ranges between 0.04 µm and 0.09 µm. Since the second alignment marks AM2 have smooth top surfaces $T_{AM2}$ and the top surfaces $T_{AM2}$ of the second alignment marks AM2 are substantially coplanar with the top surface $T_{532}$ of the first dielectric layer 532 adjacent thereto, better resolution of the second alignment marks AM2 may be obtained by the machinery during the exposure/alignment process. As such, the subsequently formed elements may be accurately formed on the designated location, thereby enhancing the reliability of the InFO package 10.

In some embodiments, the first routing patterns RP1, the second conductive vias CV2, the second alignment marks AM2, and the second dielectric layer 532 may constitute a second sub-layer of the subsequently formed redistribution structure 500 (shown in FIG. 1T). In some embodiments, the second sub-layer is formed over the first sub-layer. The second dielectric layer 532 wraps around the first routing patterns RP1, the second conductive vias CV2, and the second alignment marks AM2. That is, the first routing patterns RP1, the second conductive vias CV2, and the second alignment marks AM2 are embedded in the second dielectric layer 532. In some embodiments, the second conductive vias CV2 are disposed on the first routing patterns RP1. In some embodiments, the first routing patterns RP1 are sandwiched between the first conductive vias CV1 and the second conductive vias CV2. In some embodiments, the second conductive vias CV2 are free of seed layer.

Referring to FIG. 1R, since the second dielectric layer 532 wraps around sidewalls of the second alignment marks AM2, the second dielectric layer 532 is able to protect the sidewalls of the second alignment marks AM2 from being damaged by the subsequent processes (i.e. etching process or the like). That is, in some embodiments, each of the second alignment marks AM2 has substantially straight sidewalls. For example, an included angle formed between the sidewalls of the second alignment mark AM2 and a virtual line extending along a direction perpendicular to the top surface $T_{AM2}$ of the second alignment mark AM2 may range between 85° and 90°.

Referring to FIG. 1S, a plurality of second routing patterns RP2 and a plurality of third alignment marks AM3 are respectively formed on the second conductive vias CV2 and the second dielectric layer 532. Each of the second routing patterns RP2 includes a seed layer 514a and a conductive pattern 542a. Each of the third alignment marks AM3 includes a seed layer 542b and a conductive pattern 514b. In some embodiments, the second routing patterns RP2 may be formed by similar methods as that of the first routing pattern RP1 or the first conductive vias CV1 and the third alignment marks AM3 may be formed by similar methods as that of the first alignment mark AM1. Therefore, detailed descriptions of the second routing patterns RP2 and the third alignment marks AM3 are omitted herein. In some embodiments, the precision of the locations of the second routing patterns RP2 and the third alignment mark AM3 may be ensured by using the second alignment mark AM2 as an alignment tool. In some embodiments, the second routing patterns RP2 are located in the active region AR and the third alignment marks AM3 are located in the border region BR. The second routing patterns RP2 may include routing traces for signal transmission along the horizontal plane. On the other hand, the third alignment marks AM3 may ensure other subsequently formed elements are precisely formed on the designated location. Similar to the first alignment marks AM1 and the second alignment marks AM2, the third alignment marks AM3 may be electrically floating and may include a grid pattern. For example, each of the third alignment marks AM3 is constituted by multiple conductive patterns 542b. It should be noted that the third alignment mark AM3 may also adapt the configurations illustrated in FIG. 2A to FIG. 2C.

Referring to FIG. 1T, a third dielectric layer 534 is formed over the second sub-layer. For example, the third dielectric layer 534 is stacked on the second dielectric layer 532. The third dielectric layer 534 has a plurality of openings OP4. In some embodiments, the precision of the locations of the openings OP4 may be ensured by using the third alignment mark AM3 as an alignment tool. In some embodiments, the openings OP4 partially exposes the conductive patterns 542a of the second routing patterns RP2 and completely exposes the third alignment marks AM3. However, the disclosure is not limited thereto. In some alternative embodiments, the third dielectric layer 534 may completely cover the third alignment marks AM3. The third dielectric layer 534 may be formed by the following steps. First, a dielectric material layer (not shown) is formed over the second dielectric layer 532 to cover the second routing patterns RP2 and the third alignment marks AM3. In some embodiments, a material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like. Thereafter, the dielectric material layer may be patterned through a photolithography process and an etching process to render the third dielectric layer 534 having the openings OP4.

Referring to FIG. 1U, a plurality of third routing patterns RP3 are formed on the second routing patterns RP2 to obtain a redistribution structure 500. In some embodiments, the third routing patterns RP3 includes a seed layer 516a and a plurality of conductive patterns 544a. In some embodiments, the third routing patterns RP3 are located in the active region AR. The third routing patterns RP3 may be formed by the following steps. First, a first mask pattern (not shown) may be adapted to cover/protect the third alignment marks AM3. Subsequently, a seed material layer (not shown) extending into the openings OP4 may be formed over the third dielectric layer 534. The seed material layer may be formed through, for example, a sputtering process, a physical vapor deposition (PVD) process, or the like. In some embodiments, the seed material layer may include, for example, copper, titanium-copper alloy, or other suitable choice of materials. A second mask pattern (not shown) may then be formed on the seed material layer. The second mask pattern has openings exposing the seed material layer located inside of the openings OP4. In some embodiments, the openings of the second mask pattern also exposes portions of the seed material layer in proximity of the openings OP4. Thereafter, a conductive material (not shown) is filled into the openings of the second mask and the openings OP4 of the third dielectric layer 534 by electroplating or deposition. Then, the first and second mask patterns and the seed material layer underneath the second mask pattern are removed to obtain the third routing patterns RP3.

In some embodiments, the second routing patterns RP2, the third routing patterns RP3, the third alignment marks AM3, and the third dielectric layer 534 may be considered as a third sub-layer of the redistribution structure 500. In some embodiments, the third routing patterns RP3 may include a plurality of pads. In some embodiments, the above-mentioned pads includes a plurality of under-ball metallurgy (UBM) patterns for ball mount.

As illustrated in FIG. 1U, the redistribution structure 500 includes the first dielectric layer 530, the second dielectric layer 532, the third dielectric layer 534, the first conductive vias CV1, the second conductive vias CV2, the first routing patterns RP1, the second routing patterns RP2, the third routing patterns RP3, the first alignment marks AM1, the second alignment marks AM2, and the third alignment marks AM3. The first conductive vias CV1 and the first alignment marks AM1 are embedded in the first dielectric layer 530. The second conductive vias CV2, the first routing patterns RP1, and the second alignment marks AM2 are embedded in the second dielectric layer 532. The second routing patterns RP2 are embedded in the third dielectric layer 534 while the third routing patterns RP3 are partially embedded in the third dielectric layer 534. A portion of the first conductive vias CV1 is in physical contact with the conductive structures 200 and the first routing patterns RP1. Another portion of the first conductive vias CV1 is in physical contact with the vias 350 of the dies 300 and the first routing patterns RP1. That is, the first conductive vias CV1 electrically connect the conductive structures 200, the dies 300, and the first routing patterns RP1. The second conductive vias CV2 are in physical contact with the first routing patterns RP1 and the second routing patterns RP2. That is, the second conductive vias electrically interconnect the first routing patterns RP1 and the second routing patterns RP2. The second routing patterns RP2 are in physical contact with the second conductive vias CV2 and the third routing patterns RP3. That is, the second routing patterns RP2 are electrically connected to the second conductive vias CV2 and the third routing patterns RP3.

In some embodiments, the redistribution structure 500 is referred to as a front-side redistribution structure. It should be noted that although the redistribution structure 500 is illustrated to have three sub-layers in FIG. 1U, the disclosure is not limited thereto. In some alternative embodiments, the redistribution structure 500 may be constituted by more or less layers of sub-layers depending on the circuit design.

Referring to FIG. 1V, after the redistribution structure 500 is formed, a plurality of conductive terminals 600 are placed on the third routing patterns RP3 (the UBM patterns) of the redistribution structure 500. In some embodiments, the conductive terminals 600 are electrically connected to the redistribution structure 500. In some embodiments, the conductive terminals 600 include solder balls. In some embodiments, the conductive terminals 600 may be placed on the UBM patterns through a ball placement process.

Referring to FIG. 1V and FIG. 1W, after the conductive terminals 600 are formed on the redistribution structure 500, the redistribution structure 100 is separated from the de-bonding layer DB and the carrier 100. In some embodiments, the de-bonding layer DB (e.g., the LTHC release layer) may be irradiated by an UV laser such that the carrier C and the de-bonding layer DB may be peeled off. Nevertheless, the de-bonding process is not limited thereto. Other suitable de-carrier methods may be used in some alternative embodiments. After removing the de-bonding layer DB and the carrier C, the structure is flipped upside down and is placed on a tape TP.

Referring to FIG. 1X, a plurality of openings OP5 are formed in the dielectric layer 104 to partially expose the redistribution conductive layer 102. In some embodiments, when multiple redistribution conductive layers 102 are present, the openings OP5 expose the bottommost redistribution conductive layer 102. In some embodiments, the openings OP5 are formed by a laser drilling process, a mechanical drilling process, a photolithography process, or other suitable processes. Thereafter, a plurality of conductive terminals 700 are formed over the redistribution structure 100. In some embodiments, at least part of the conductive terminals 700 extends into the openings OP5 to be in contact with the redistribution conductive layer 102, thereby rendering electrical connection with the redistribution structure 100. In some embodiments, the conductive terminals 700 are attached to the redistribution conductive layer 102 through a solder flux (not shown). In some embodiments, the conductive terminals 700 are, for example, solder balls. In some embodiments, the conductive terminals 700 may be disposed on the redistribution conductive layer 102 by a ball placement process and/or a reflow process.

Referring to FIG. 1X and FIG. 1Y, the structure illustrated in FIG. 1X is diced or singulated. Thereafter, the diced structure is removed from the tape TP to form a plurality of InFO packages 10. In some embodiments, the dicing process or the singulation process typically involves dicing with a rotating blade or a laser beam. In other words, the dicing or singulation process is, for example, a laser cutting process, a mechanical cutting process, or other suitable processes.

Figure 4:
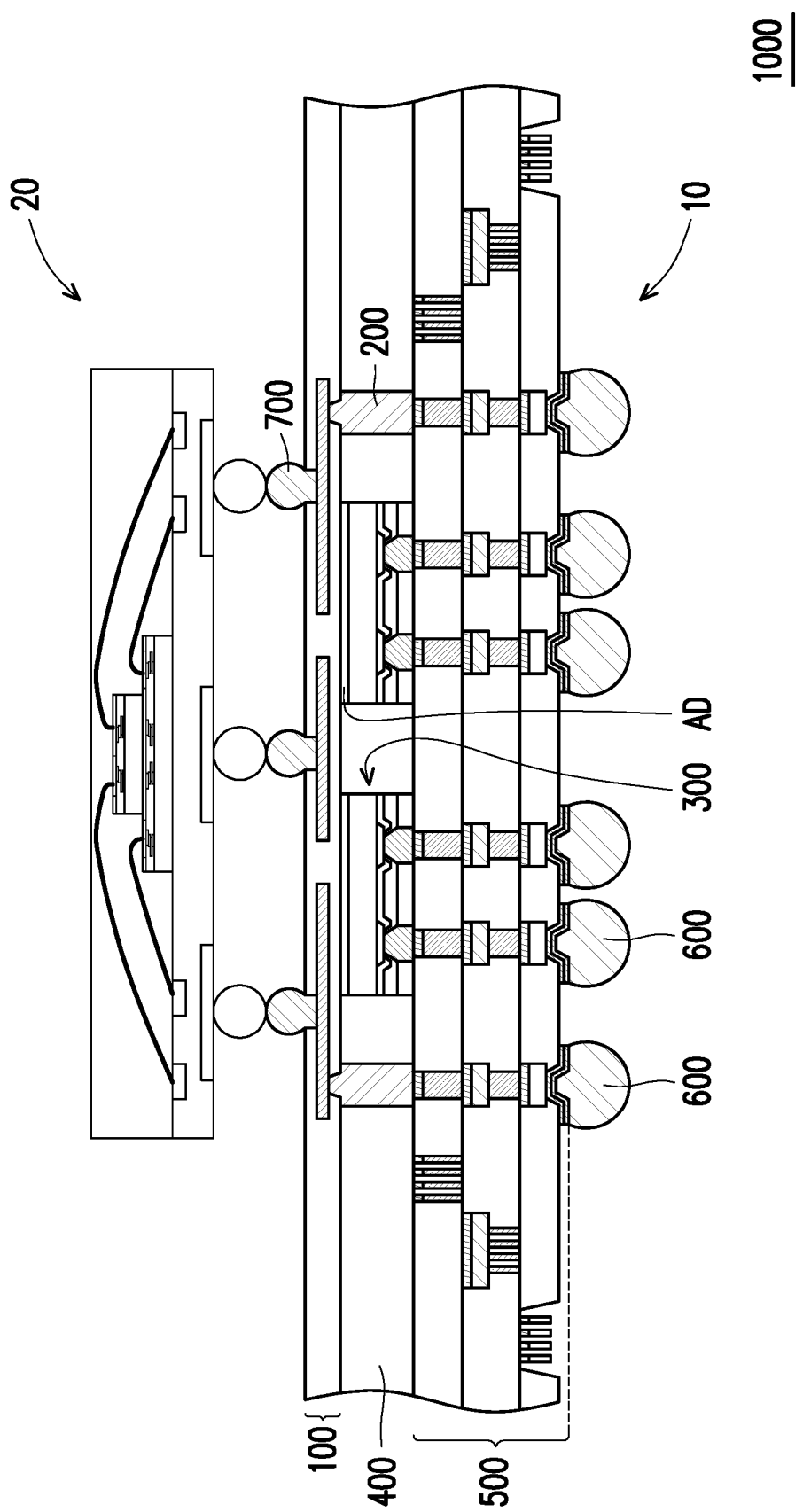
FIG. 4 is a schematic cross-sectional view illustrating a package-on-package (PoP) structure.

FIG. 4 is a schematic cross-sectional view illustrating a package-on-package (PoP) structure 1000. Referring to FIG. 4, in some embodiments, the InFO package 10 obtained in FIG. 1Y may have a dual-side terminal design to accommodate other electronic components. For example, a sub-package 20 may be stacked on the InFO package 10. The sub-package 20 is, for example, IC packages. The sub-package 20 is electrically connected to the InFO package 10 through the conductive terminals 700. In some embodiments, after the sub-package 20 is stacked on the InFO package 10, a reflowing process is further performed to enhance the adhesion between the InFO package 10 and the sub-package 20. It is noted that FIG. 4 merely serves as an exemplary illustration, and the disclosure is not limited thereto. In some alternative embodiments, other electronic devices such as an integrated fan-out (InFO) package, a memory device, a ball grid array (BGA), or a wafer may be stacked over the InFO package 10 in place of the sub-packages 20.

Figure 5:
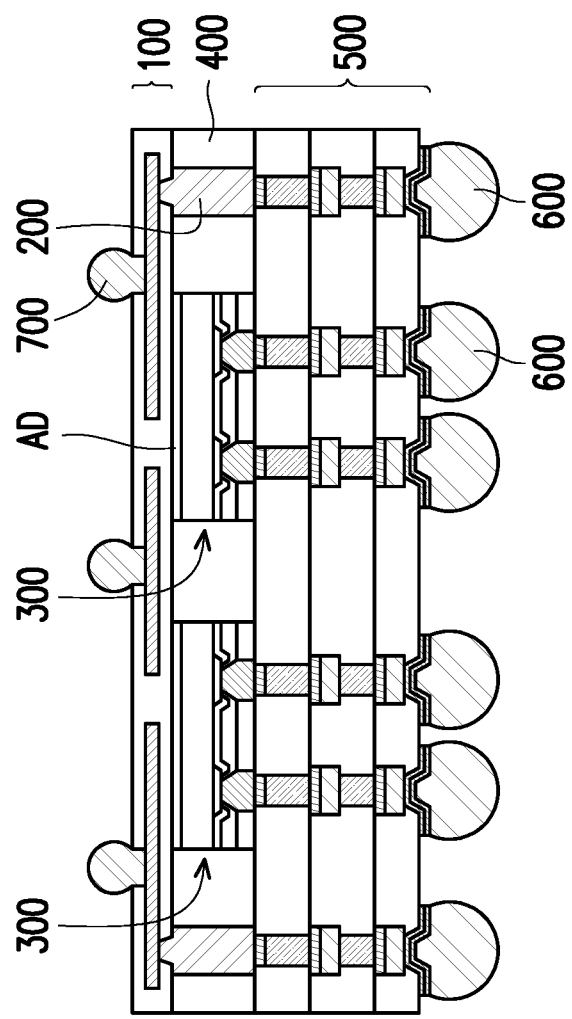
FIG. 5 is a cross-sectional view illustrating an InFO package in accordance with some alternative embodiments of the disclosure.

FIG. 5 is a cross-sectional view illustrating an InFO package 20 in accordance with some alternative embodiments of the disclosure. Referring to FIG. 5, the InFO package 20 is similar to the InFO package 10 illustrated in FIG. 1Y, so the detailed descriptions thereof are omitted herein. However, during the manufacturing process of the InFO package 20, the alignment marks are formed within the scribe line. Therefore, after the singulation process, the alignment marks will be cut out from the InFO package 20.

FIG. 6A to FIG. 6I are schematic cross-sectional views illustrating intermediate stages of a manufacturing process of an InFO package 30 in accordance with some alternative embodiments of the disclosure. In some embodiments, the InFO package 30 may be manufactured by performing processes similar to the steps illustrated in FIG. 1A to FIG. 1Y except the alteration of the steps of forming the redistribution structure 500. That is, the steps illustrated in FIG. 1F to FIG. 1U may be replaced by the steps illustrated in FIG. 6A to FIG. 6H.

Referring to FIG. 6A, the steps illustrated in FIG. 1A to FIG. 1E may be performed. Thereafter, a photoresist layer PR1' is formed over the seed material layer 510. In some embodiments, the photoresist layer PR1 may be formed through spin-coating or other suitable formation methods. As illustrated in FIG. 6A, the photoresist layer PR1' has a plurality of openings OP1' exposing at least a portion of the seed material layer 510. In some embodiments, the openings OP1' are located in the border region BR. On the other hand, the active region AR is free of the openings OP1'.

Figure 6B:
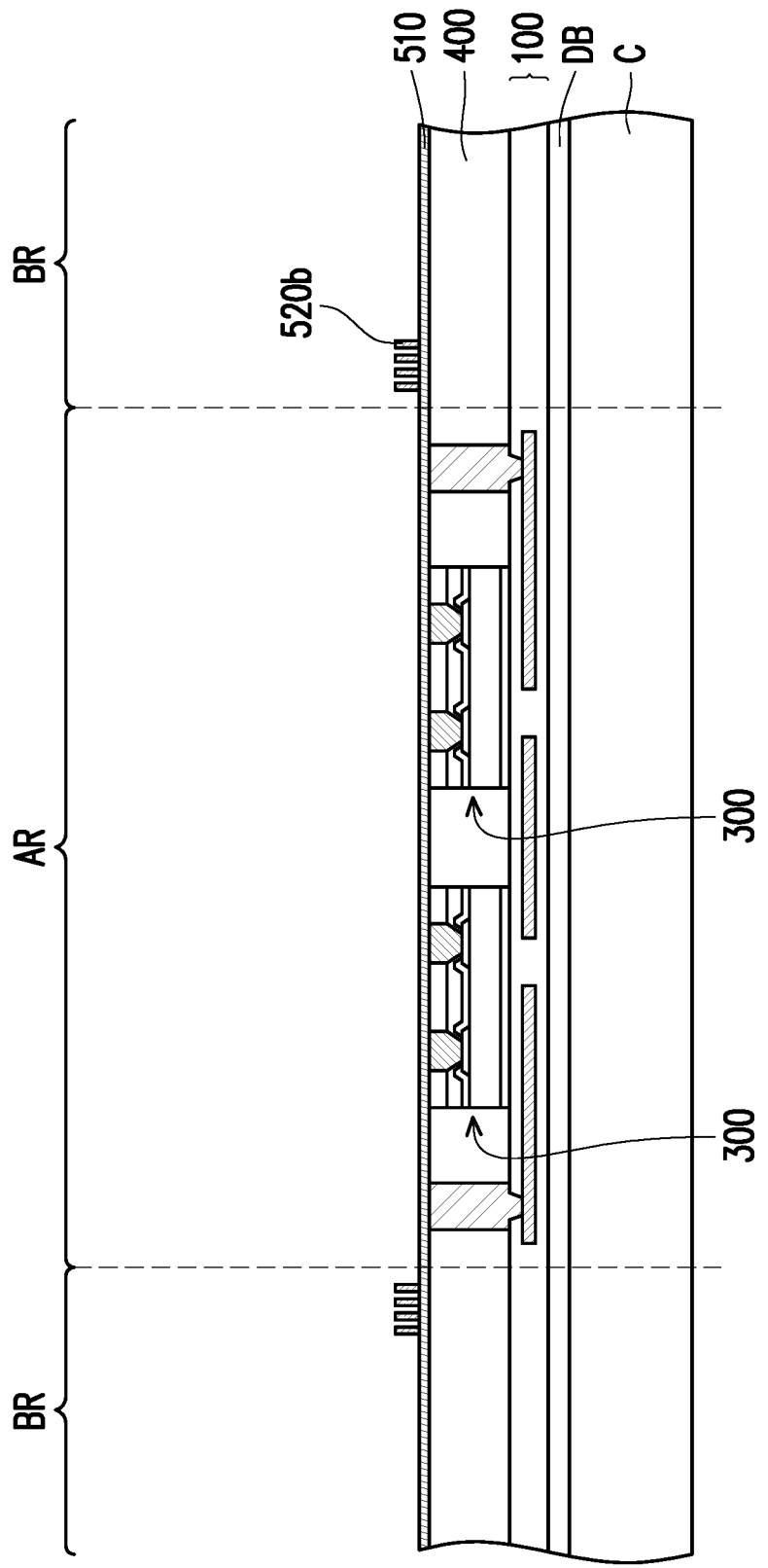

Referring to FIG. 6A and FIG. 6B, a plurality of conductive patterns 520b are formed on the seed material layer 510. In some embodiments, a conductive material (not shown) is filled into the openings OP1' of the photoresist layer PR1'. Thereafter, the photoresist layer PR1 is removed to obtain the conductive patterns 520b located in the border region BR. Upon removal of the photoresist layer PR1', portions of the seed material layer 510, which are not covered by the conductive patterns 520b, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer PR1' may be removed/stripped through, for example, etching, ashing, or other suitable removal processes.

Figure 6C:
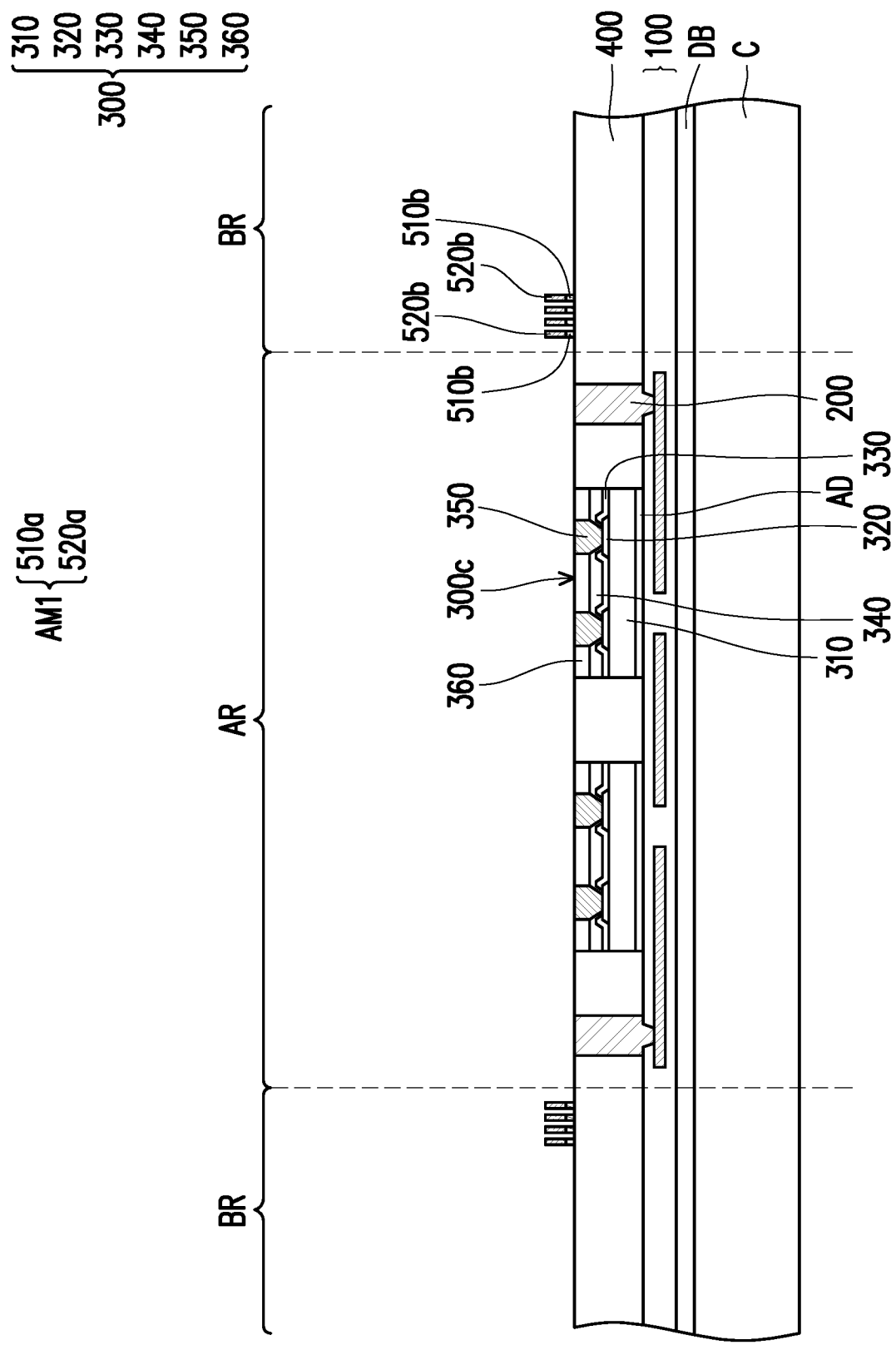

Referring to FIG. 6B and FIG. 6C, the seed material layer 510 that is not covered by the conductive patterns 520b is removed to render seed layer 510b. That is, the seed material layer 510 underneath the photoresist layer PR1' is removed. The exposed portions of the seed material layer 510 may be removed through an etching process. In some embodiments, the material of the conductive patterns 520b may be different from the material of the seed material layer 510, so the exposed portion of the seed material layer 510 may be removed through selective etching. In some embodiments, the seed layer 510b may include a plurality of seed layer patterns. As illustrated in FIG. 6C, the seed layer patterns are aligned with the conductive patterns 520b along a direction perpendicular to the active surface 300c of the die 300. For example, sidewalls of each seed layer pattern are aligned with sidewalls of each conductive pattern 520b.

In some embodiments, the conductive patterns 520b and the seed layer 510b located in the border region BR may be collectively referred to as first alignment marks AM1. The first alignment marks AM1 may ensure other subsequently formed elements are precisely formed on the designated location. In some embodiments, the first alignment marks AM1 are electrically floating. For example, the first alignment marks AM1 are electrically insulated from the conductive structures 200, the vias 350 of the dies 300, and the redistribution structure 100. In some embodiments, the first alignment marks AM1 are in physical contact with the encapsulant 400. For example, the seed layer 510b of the first alignment marks AM1 may be directly in contact with the encapsulant 400. In some embodiments, each of the first alignment marks AM1 may be a grid pattern from a top view. That is, one first alignment mark AM1 includes multiple conductive patterns 520b.

Referring to FIG. 6D, a dielectric material layer 530a is formed over the encapsulant 400, the conductive structures 200, and the dies 300 to encapsulate the first alignment marks AM1. In other words, the first alignment marks AM1 are not revealed and are well protected by the dielectric material layer 530a. In some embodiments, a material of the dielectric material layer 530a includes polyimide, epoxy resin, acrylic resin, phenol resin, BCB, PBO, or any other suitable polymer-based dielectric material. The dielectric material layer 530a may be formed by suitable fabrication techniques, such as spin-on coating, chemical vapor deposition (CVD), plasma-enhanced chemical vapor deposition (PECVD), or the like.

Figure 6E:
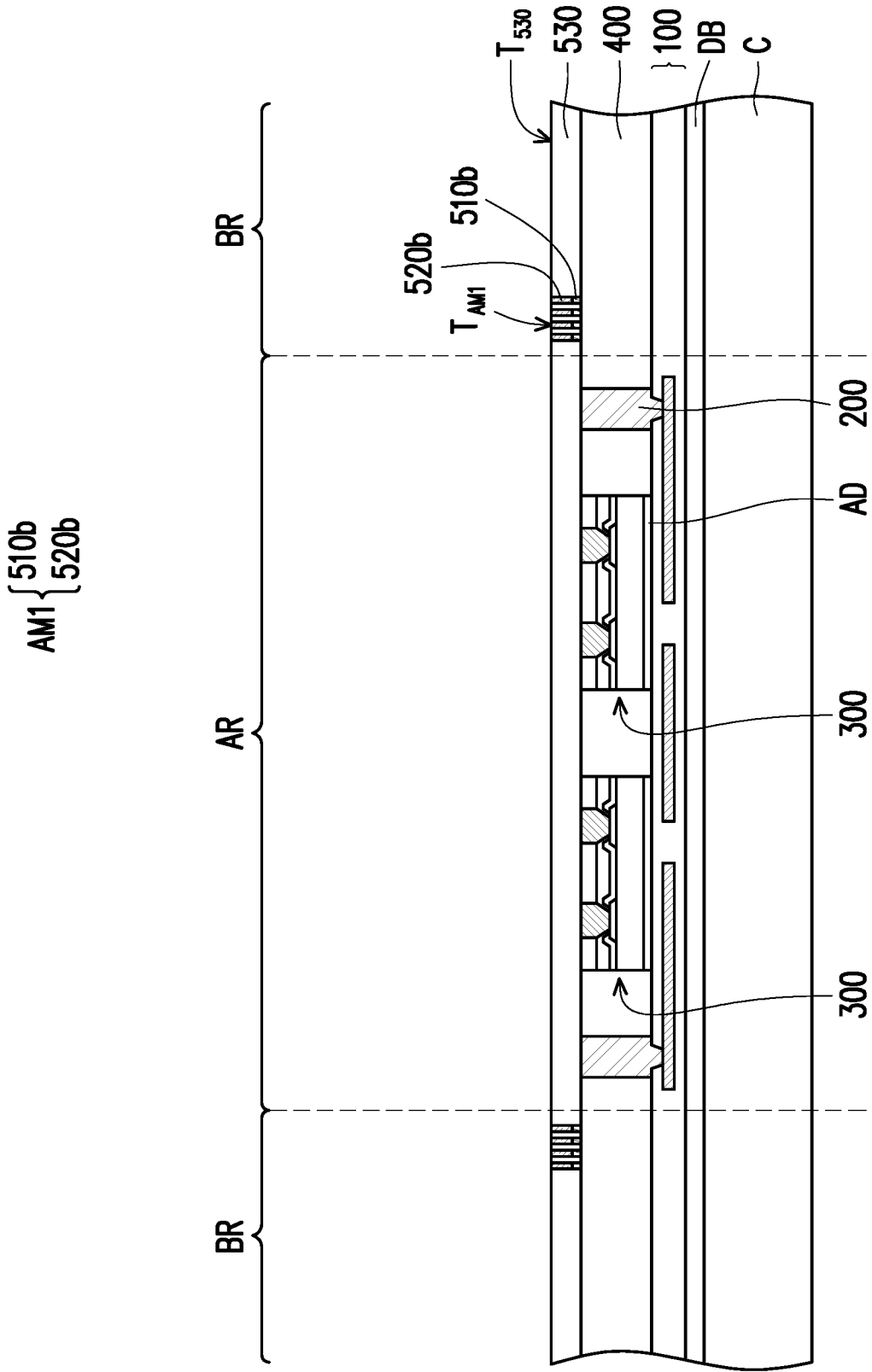

Referring to FIG. 6D and FIG. 6E, a portion of the dielectric material layer 530a is removed to form a first dielectric layer 530 exposing top surfaces TAMI of the first alignment marks AM1. For example, the dielectric material layer 530a may be grinded until top surfaces $T_{AM1}$ of the first alignment marks AM1 are exposed. In some embodiments, the dielectric material layer 530a is grinded by a chemical mechanical polishing (CMP) process.

In some embodiments, the dielectric material layer 530a is grinded such that a top surface $T_{530}$ of the first dielectric layer 530 is substantially coplanar with the top surfaces $T_{AM1}$ of the first alignment marks AM1. However, the disclosure is not limited thereto. In some alternative embodiments, the top surface $T_{530}$ of the first dielectric layer 530 may be located at a level height different from the top surfaces $T_{AM1}$ of the first alignment marks AM1. Nevertheless, the height difference may be negligible. In some embodiments, after the top surfaces $T_{AM1}$ of the first alignment mark AM1 are exposed, these surfaces are further grinded to render a smooth profile. Since the first alignment marks AM1 have smooth top surfaces TAMI and the top surfaces TAMI of the first alignment marks AM1 are substantially coplanar with the top surface $T_{530}$ of the first dielectric layer 530 adjacent thereto, better resolution of the first alignment marks AM1 may be obtained by the machinery during the exposure/alignment process. As such, the subsequently formed elements may be accurately formed on the designated location, thereby enhancing the reliability of the InFO package 30.

Figure 6F:
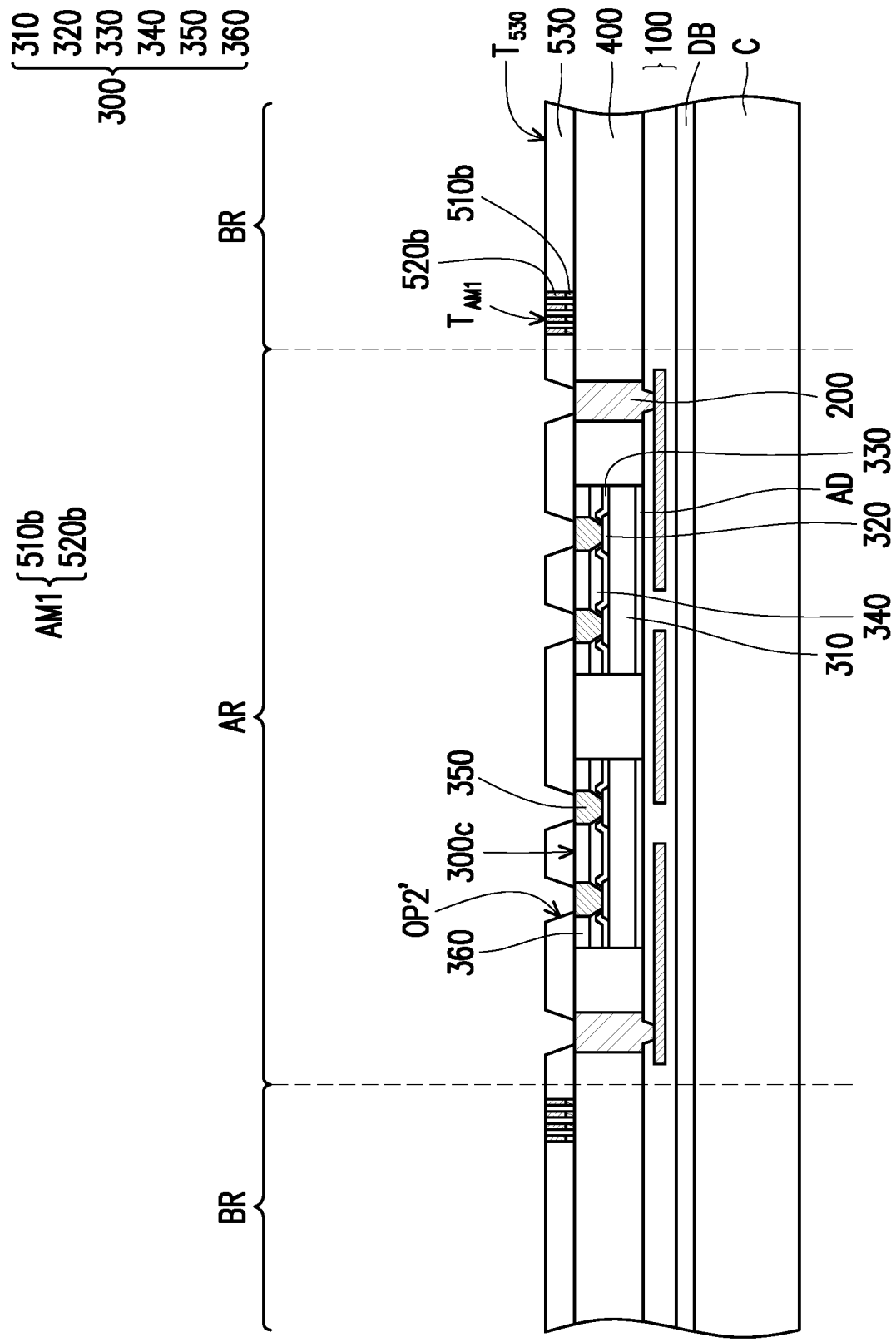

Referring to FIG. 6F, the first dielectric layer 530 is patterned to form a plurality of openings OP2' in the active region AR. In some embodiments, the openings OP2' expose the conductive structures 200 and the vias 350 of the dies 300 located underneath the first dielectric layer 530. In other words, the locations of the openings OP2' correspond to the locations of the conductive structures 200 and vias 350. In some embodiments, the border region BR is free of openings OP2'. In some embodiments, the precision of the locations of the openings OP2' may be ensured by using the first alignment mark AM1 as an alignment tool. The first dielectric layer 530 may be patterned through a photolithography process and an etching process.

Figure 6G:
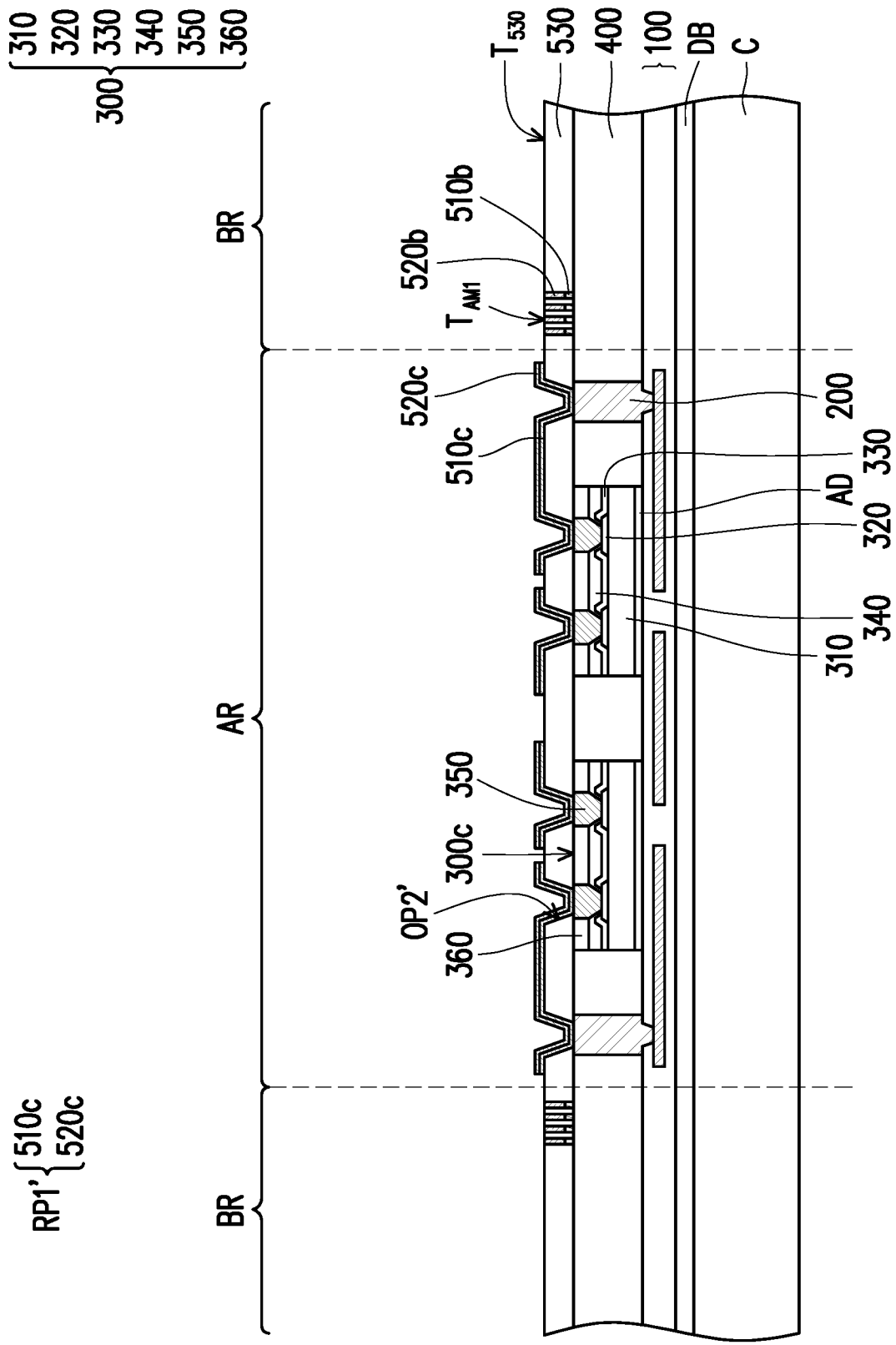

Referring to FIG. 6G, a plurality of first routing patterns RP1' are formed over the first dielectric layer 530. In some embodiments, the first routing patterns RP1' extends into the openings OP2' to be directly in contact with the conductive structures 200 and the vias 350 of the die 300. In some embodiments, each first routing pattern RP1' includes a seed layer 510c and a conductive pattern 520c. In some embodiments, the first routing pattern RP1' may be formed by the following manner. First, a seed material layer (not shown) may be formed over the first dielectric layer 530. The seed material layer is formed in a conformal manner such that the seed material layer extends into the openings OP2' of the first dielectric layer 530 to cover a bottom surface and sidewalls of the openings OP2'. The seed material layer may be formed through, for example, a sputtering process, a physical vapor deposition (PVD) process, or the like. In some embodiments, the seed material layer may include, for example, copper, titanium-copper alloy, or other suitable choice of materials.

Thereafter, a photoresist pattern layer (not shown) is formed over the seed material layer. In some embodiments, the photoresist pattern layer exposes the seed material layer located in the openings OP2' and exposes at least a portion of the seed material layer located on the first dielectric layer 530 and around the openings OP2'. Subsequently, a conductive material (not shown) is deposited onto the exposed seed material layer using the photoresist pattern layer as a mask to form the conductive patterns 520c. In some embodiments, the conductive material may be formed by a plating process. The plating process is, for example, electro-plating, electroless-plating, immersion plating, or the like. In some embodiments, the conductive material includes, for example, copper, copper alloys, or the like. After forming the conductive patterns 520c, the photoresist pattern layer is removed to expose portions of the seed material layer not covered by the conductive patterns 520c. The portions of the seed material layer not covered by the conductive patterns 520c are then removed to obtain the seed layer 510c of the first routing patterns RP1'. As illustrated in FIG. 6A to FIG. 6G, the first alignment marks AM1 are formed prior to the formation of the first routing patterns RP1'.

Referring to FIG. 6H, the process similar to the steps shown in FIG. 1L to FIG. 1R (except the first routing patterns RP1 and the second conductive vias CV2 are not formed) and FIG. 6A to FIG. 6G may be repeated to obtain the second routing patterns RP2', the second alignment marks AM2, and the second dielectric layer 532. Similar to the first routing patterns RP1', each second routing pattern RP2' also includes a seed layer 514c and a conductive pattern 542c. In some embodiments, the process similar to the steps shown in FIG. 1S to FIG. 1U (except the second routing patterns RP2 are not formed) may be adapted to form the third routing patterns RP3, the third alignment marks AM3, and the third dielectric layer 534. In some embodiments, each third routing patterns RP3 includes a seed layer 516a and a conductive pattern 544a. In some embodiments, the first routing patterns RP1', the second routing patterns RP2, and the third routing patterns RP3 are electrically connected to each other. In some embodiments, the first routing patterns RP1', the second routing patterns RP2', and the third routing patterns RP3 are also electrically connected to the conductive structures 200 and the vias 350 of the die 300. In some embodiments, the second routing patterns RP2' are directly in contact with the first routing patterns RP1', and the third routing patterns RP3 are directly in contact with the second routing patterns RP2'. As illustrated in FIG. 6H, a portion of the first routing patterns RP1' is embedded in the first dielectric layer 530 and another portion of the first routing patterns RP1' is embedded in the second dielectric layer 532. Similarly, a portion of the second routing patterns RP2' is embedded in the second dielectric layer 532 and another portion of the second routing patterns RP2' is embedded in the third dielectric layer 543.

Referring to FIG. 6I, process similar to the steps shown in FIG. 1V to FIG. 1Y may be performed to obtain the InFO package 30.

In accordance with some embodiments of the disclosure, an integrated fan-out (InFO) package includes an encapsulant, a die, a plurality of conductive structures, and a redistribution structure. The die and the conductive structures are encapsulated by the encapsulant. The conductive structures surround the die. The redistribution structure is disposed on the encapsulant. The redistribution structure includes a plurality of routing patterns, a plurality of conductive vias, and a plurality of alignment marks. The conductive vias interconnects the routing patterns. At least one of the alignment mark is in physical contact with the encapsulant.

In accordance with some embodiments of the disclosure, an integrated fan-out (InFO) package includes an encapsulant, a die, a plurality of conductive structures, and a redistribution structure. The die and the conductive structures are encapsulated by the encapsulant. The conductive structures surround the die. The redistribution structure is disposed on the encapsulant. The redistribution structure includes a first dielectric layer, a second dielectric layer, a first alignment mark, and a second alignment mark. The second dielectric layer is stacked on the first dielectric layer. The first alignment mark is embedded in the first dielectric layer, and the second alignment mark is embedded in the second dielectric layer. The first alignment mark includes a first seed layer and a plurality of first conductive patterns. The first conductive patterns are stacked on the first seed layer. The second alignment mark includes a second seed layer, a second conductive pattern, and a plurality of third conductive patterns. The second conductive pattern is sandwiched between the second seed layer and the third conductive patterns.

In accordance with some embodiments of the disclosure, a manufacturing method of an integrated fan-out (InFO) package includes at least the following steps. A carrier is provided. A die and a plurality of conductive structures are formed over the carrier. The conductive structures surround the die. The die and the conductive structures are encapsulated by an encapsulant. A redistribution structure is formed over the encapsulant. The redistribution structure includes a first alignment mark physically in contact with the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out (InFO) package having an active region and a border region surrounding the active region, comprising:
  an encapsulant;
  a die and a plurality of conductive structures encapsulated by the encapsulant, wherein the plurality of conductive structures surround the die;
  a redistribution structure disposed on the encapsulant, wherein the redistribution structure comprises a plurality of routing patterns, a plurality of conductive vias, and a plurality of alignment marks, the plurality of conductive vias interconnect the plurality of routing patterns, at least one of the plurality of alignment marks is in physical contact with the encapsulant, the plurality of alignment marks are electrically floating, the plurality of conductive structures and the plurality of alignment marks are located at different level heights, the plurality of alignment marks are located in the border region, each of the plurality of alignment marks is vertically offset from one another in the same border region, and the border region is devoid of the die, the plurality of routing patterns, and the plurality of conductive vias.

2. The InFO package according to claim 1, wherein each of the plurality of alignment marks comprises a grid pattern.

3. The InFO package according to claim 1, further comprising a plurality of conductive terminals over the redistribution structure, wherein the plurality of conductive terminals are electrically connected to the redistribution structure.

4. The InFO package according to claim 1, wherein the redistribution structure further comprises a plurality of dielectric layers stacked on each other, at least one of the plurality of dielectric layers wraps around the corresponding routing pattern, the corresponding conductive via, and the corresponding alignment mark, and a top surface of the at least one of the plurality of dielectric layers is substantially coplanar with a top surface of the corresponding via and a top surface of the corresponding alignment mark.

5. The InFO package according to claim 1, wherein the redistribution structure further comprises a plurality of dielectric layers stacked on each other, at least one of the plurality of alignment mark is embedded in at least one of the plurality of dielectric layers, and a distance between a top surface of the at least one of the plurality of dielectric layers and a top surface of the at least one of the plurality of alignment marks is less than 0.6 µm.

6. The InFO package according to claim 1, wherein at least one of the plurality of alignment mark comprises a seed layer, a first conductive pattern, and a plurality of second conductive patterns, and the first conductive pattern is sandwiched between the plurality of second conductive patterns and the seed layer.

7. The InFO package according to claim 1, wherein the die, the plurality of conductive structures, the plurality of routing patterns, and the plurality of conductive vias are located in the active region.

8. An integrated fan-out (InFO) package, comprising:
an encapsulant;
a die and a plurality of conductive structures encapsulated by the encapsulant, wherein the plurality of conductive structures surround the die;
a redistribution structure disposed on the encapsulant, wherein the redistribution structure comprises:
a first dielectric layer;
a plurality of first conductive vias embedded in the first dielectric layer;
a second dielectric layer stacked on the first dielectric layer;
a plurality of second conductive vias embedded in the second dielectric layer and being free of seed layer;
a plurality of first routing patterns embedded in the second dielectric layer and being sandwiched between the plurality of first conductive vias and the plurality of second conductive vias;
a first alignment mark embedded in the first dielectric layer, wherein the first alignment mark comprises a first seed layer and a plurality of first conductive patterns, the plurality of first conductive patterns are stacked on the first seed layer; and
a second alignment mark embedded in the second dielectric layer, wherein the second alignment mark comprises a second seed layer, a second conductive pattern, and a plurality of third conductive patterns, and the second conductive pattern is sandwiched between the second seed layer and the plurality of third conductive patterns.

9. The InFO package according to claim 8, wherein the first seed layer of the first alignment mark is in physical contact with the encapsulant.

10. The InFO package according to claim 8, wherein the first seed layer comprises a plurality of first seed layer patterns, and sidewalls of each of the plurality of first seed layer patterns are aligned with sidewalls of each of the plurality of first conductive patterns.

11. The InFO package according to claim 8, wherein the first alignment mark and the second alignment mark are electrically floating.

12. The InFO package according to claim 8, wherein the plurality of the first conductive vias and the plurality of first routing patterns respectively comprises a seed layer.

13. The InFO package according to claim 8, wherein top surfaces of the plurality of first conductive vias are substantially coplanar with top surfaces of the plurality of first conductive patterns of the first alignment mark, and top surfaces of the plurality of second conductive vias are substantially coplanar with top surfaces of the plurality of third conductive patterns of the second alignment mark.

14. The InFO package according to claim 8, further comprising a plurality of conductive terminals over the redistribution structure, wherein the plurality of conductive terminals are electrically connected to the redistribution structure.

15. A manufacturing method of an integrated fan-out (InFO) package having an active region and a border region surrounding the active region, comprising:
providing a carrier;
forming a die and a plurality of conductive structures over the carrier, wherein the plurality of conductive structures surround the die;
encapsulating the die and the plurality of conductive structures by an encapsulant; and
forming a redistribution structure over the encapsulant, wherein the redistribution structure comprises a plurality of routing patterns, a plurality of first conductive vias, a plurality of second conductive vias, a first alignment mark, and a second alignment mark, the plurality of routing patterns is sandwiched between the plurality of the first conducive vias and the plurality of second conductive vias, the first alignment mark is physically in contact with the encapsulant, the first alignment mark and the second alignment mark are electrically floating and are located in the border region, the first alignment mark and the second alignment mark are located at different level heights and are vertically offset from each other in the same border region, and the border region is devoid of the die, the plurality of routing patterns, the plurality of first conductive vias, and the plurality of second conductive vias.

16. The InFO package according to claim 8, wherein the InFO package has an active region and a border region surrounding the active region, the border region is devoid of the die, the plurality of first conductive vias, the plurality of second conductive vias, and the plurality of first routing patterns, the first alignment mark and the second alignment mark are located in the border region, and the first alignment mark and the second alignment mark are vertically offset from each other in the same border region.

17. The method according to claim 15, wherein the step of forming the redistribution structure comprises:

forming a first sub-layer over the encapsulant, the die, and the plurality of conductive structures, comprising:
  forming a first seed material layer over the encapsulant, the die, and the plurality of conductive structures;
  forming a first photoresist layer over the first seed material layer, wherein the first photoresist layer comprises a plurality of first openings exposing at least a portion of the first seed material layer;
  filling a first conductive material into the plurality of first openings of the first photoresist layer to form a plurality of first conductive patterns;
  removing the first photoresist layer and portions of the first seed material layer underneath the first photoresist layer to form the plurality of first conductive vias and the first alignment mark;
  forming a first dielectric material layer over the encapsulant, the die, and the plurality of conductive structures to encapsulate the plurality of first conductive vias and the first alignment mark; and
  removing a portion of the first dielectric material layer to form a first dielectric layer exposing a top surface of the plurality of first conductive vias and a top surface of the first alignment mark.

18. The method according to claim 17, wherein a top surface of the first dielectric layer is substantially coplanar with the top surface of the plurality of first conductive vias and the top surface of the first alignment mark.

19. The method according to claim 17, wherein the step of forming the redistribution structure further comprises:
  forming a second sub-layer over the first-sub layer, comprising:
    forming a second seed material layer over the first-sub layer;
    forming a second photoresist layer over the second seed material layer, wherein the second photoresist layer comprises a plurality of second openings exposing at least a portion of the second seed material layer;
    filling a second conductive material into the plurality of second openings of the second photoresist layer to form a plurality of second conductive patterns;
    removing the second photoresist layer;
    forming a third photoresist layer over the second seed material layer and the plurality of second conductive patterns, wherein the third photoresist layer comprises a plurality of third openings exposing at least a portion of the plurality of second conductive patterns;
    filling a third conductive material into the plurality of third openings of the third photoresist layer to form a plurality of third conductive patterns;
    removing the third photoresist layer and portions of the second seed material layer exposed by the plurality of second conductive patterns to form the plurality of routing patterns, the plurality of second conductive vias, and the second alignment mark, wherein the plurality of second conductive vias is disposed on the plurality of routing patterns;
    forming a second dielectric material layer over the first-sub layer to encapsulate the plurality of routing patterns, the plurality of second conductive vias, and the second alignment mark; and
    removing a portion of the second dielectric material layer to form a second dielectric layer exposing a top surface of the plurality of second conductive vias and a top surface of the second alignment mark.

20. The method according to claim 19, wherein a top surface of the second dielectric layer is substantially coplanar with the top surface of the plurality of second conductive vias and the top surface of the second alignment mark.

* * * * *